(12) United States Patent
Lee et al.

(10) Patent No.: US 10,522,550 B2
(45) Date of Patent: Dec. 31, 2019

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Ki Seok Lee, Busan (KR); Jeong Seop Shim, Seoul (KR); Mi Na Lee, Seoul (KR); Augustin Jinwoo Hong, Seoul (KR); Je Min Park, Suwon-si (KR); Hye Jin Seong, Asan-si (KR); Seung Min Oh, Seoul (KR); Do Yeong Lee, Gwangmyeong-si (KR); Ji Seung Lee, Seoul (KR); Jin Seong Lee, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/183,826

(22) Filed: Nov. 8, 2018

(65) Prior Publication Data

US 2019/0088659 A1 Mar. 21, 2019

Related U.S. Application Data

(63) Continuation of application No. 15/275,827, filed on Sep. 26, 2016, now Pat. No. 10,141,316.

(30) Foreign Application Priority Data

Jan. 8, 2016 (KR) .......................... 10-2016-0002398

(51) Int. Cl.
*H01L 27/108* (2006.01)

(52) U.S. Cl.
CPC .. *H01L 27/10885* (2013.01); *H01L 27/10814* (2013.01); *H01L 27/10823* (2013.01); *H01L 27/10855* (2013.01); *H01L 27/10891* (2013.01)

(58) Field of Classification Search
CPC ................................. H01L 27/10844–10894
See application file for complete search history.

(56) References Cited

U.S. PATENT DOCUMENTS 7,759,201 B2   7/2010   Petti et al.
8,084,310 B2   12/2011  Mebarki et al.
(Continued)

FOREIGN PATENT DOCUMENTS

KR   10-2010-0073092 A   7/2010
KR   10-2011-0115313 A   10/2011
KR   10-2013-0005185 A   1/2013

*Primary Examiner* — Asok K Sarkar
*Assistant Examiner* — Grant S Withers
(74) *Attorney, Agent, or Firm* — Lee & Morse, P.C.

(57) ABSTRACT

A semiconductor device includes a substrate including spaced-apart active regions, and device isolating regions isolating the active regions from each other, and a pillar array pattern including a plurality of pillar patterns overlapping the active regions, the plurality of pillar patterns being spaced apart from each other at an equal distance in a first direction and in a second direction intersecting the first direction, wherein the plurality of pillar patterns include first pillar patterns and second pillar patterns disposed alternatingly in the first direction and in the second direction, a shape of a horizontal cross section of the first pillar patterns being different from a shape of a horizontal cross section of the second pillar patterns.

17 Claims, 23 Drawing Sheets

(56) References Cited

U.S. PATENT DOCUMENTS

| | | |
|---|---|---|
| 8,153,519 B1 | 4/2012 | Yu |
| 8,329,512 B2 | 12/2012 | Nguyen et al. |
| 8,541,316 B2 | 9/2013 | Sukekawa |
| 8,785,328 B2 | 7/2014 | Sun et al. |
| 8,871,648 B2 | 10/2014 | Zhou et al. |
| 8,889,559 B2 | 11/2014 | Trapp et al. |
| 2013/0161787 A1 | 6/2013 | Kim et al. |
| 2013/0337652 A1* | 12/2013 | Sun .................... H01L 21/0337 438/703 |
| 2017/0025420 A1* | 1/2017 | Park .................. H01L 27/10894 |

* cited by examiner

METHOD FOR FABRICATING SEMICONDUCTOR DEVICE

CROSS-REFERENCE TO RELATED APPLICATIONS

This is a continuation application based on pending application Ser. No. 15/275,827, filed Sep. 26, 2016, the entire contents of which is hereby incorporated by reference.

Korean Patent Application No. 10-2016-0002398, filed on Jan. 8, 2016, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same.

2. Description of the Related Art

Recently, semiconductor devices, e.g., dynamic random-access memory (DRAM) devices, and so on, have been highly integrated. Such increased integration density has led into reduced contact area of the contacts and subsequently increased contact resistances. Further, bridge defects between contacts and neighboring patterns or between the contacts and neighboring active regions have increased due to reduced space therebetween. Accordingly, a method for fabricating a semiconductor device is necessary, according to which the semiconductor device has maximum lower contact area and reduced bridge defects with the neighboring elements, and includes a micro interconnect structure formable by convenient processes.

SUMMARY

According to an aspect of the present disclosure, there is provided a semiconductor device, including a substrate with spaced-apart active regions, and device isolating regions isolating the active regions and a pillar array pattern with a plurality of pillar patterns overlap the active regions, and spaced apart at an equal distance in a first direction and a second direction intersecting the first direction, wherein the plurality of pillar patterns with first and second pillar patterns disposed alternatingly in the first direction and the second direction, and a shape of a horizontal cross section of the first pattern is different from a shape of a horizontal cross section of the second pattern.

According to another aspect of the present disclosure, there is provided a semiconductor device, including a substrate with an array region and a background region, a pillar array pattern formed in the array region, and having a plurality of pillar patterns spaced apart from one another by equal distance, wherein the plurality of pillar patterns with peripheral pillar patterns formed on a boundary between the background region and the array region and a background pattern having, in the background region, an uneven portion spaced apart by a predetermined distance, along an outer surface of the peripheral pillar patterns.

According to still another aspect of the present disclosure, there is provided a semiconductor device, including a substrate with first and second regions, wherein the first region with a first array region and a first background region, and the second region having a second array region and a second background region, a first pillar array pattern formed in the first array region, and having a plurality of first pillar patterns spaced apart from one another by a first equal distance, wherein the plurality of first pillar patterns with first peripheral pillar patterns formed on a boundary between the first background region and the first array region, a second pillar array pattern formed in the second array region, and having a plurality of second pillar patterns spaced apart from one another by a second equal distance, wherein the plurality of second pillar patterns having second peripheral pillar patterns formed on a boundary between the second background region and the second array region, in the first background region, a first background pattern having a first uneven portion spaced apart from an outer surface of the first peripheral pillar patterns by a predetermined distance and in the second background region, a second background pattern having a linear portion having a flat outer surface, and a concave portion more concaved to the second array region than the linear portion is and spaced apart from the second peripheral pillar patterns by the second distance.

According to an aspect of the present disclosure, there is provided a method for fabricating a semiconductor device, including sequentially forming first and second mask layers on a substrate, forming core mask patterns spaced apart from each other by a first equal distance, by patterning the second mask layer, forming a spacer film conformally covering the core mask patterns, while forming self-aligning grooves between the core mask patterns, forming a filler for entirely filling the self-aligning grooves, forming self-aligning mask patterns between the core mask patterns by removing a portion of the spacer film, wherein the self-aligning mask patterns are formed as a portion of the spacer film and the filler are stacked, and the core mask patterns and the self-aligning mask patterns are spaced apart from each other by a second equal distance, patterning the first mask layer into a first mask pattern, with the core mask patterns and the self-aligning mask patterns as a mask and forming a pillar array pattern by patterning the first mask pattern with a mask.

According to another aspect of the present disclosure, there is provided a method for fabricating a semiconductor device, including sequentially forming first and second mask layers on a substrate having a first array region and a first background region, forming, in the first array region, core mask patterns spaced apart from each other by a first equal distance, by patterning the second mask layer, forming a spacer film conformally covering the core mask patterns, wherein the spacer film are defined so that self-aligning grooves are formed between the core mask patterns, and the array region and the background region are separated along an outer surface of the spacer film formed on side surfaces of the core mask patterns, forming a filler for entirely filling the self-aligning grooves and the first background region, forming, in the first array region, self-aligning mask patterns between the core mask patterns by removing a portion of the spacer film, wherein the self-aligning mask patterns are formed as a portion of the spacer film and the filler are stacked, and forming background mask patterns in the first background region, wherein the background mask patterns are formed as a portion of the spacer film and the filler are stacked, patterning the first mask layer into a first mask pattern, with the core mask patterns, the self-aligning mask patterns, and the background mask patterns as a mask and forming pillar array patterns and background patterns in the first array region and the first background region, respectively, by patterning with the first mask pattern as a mask.

According to another aspect of the present disclosure, there is provided a semiconductor device, including a substrate including active regions separated from each other by device isolating regions, a plurality of first and second pillar patterns on the active regions at an equal distance from each other in a first direction and in a second direction intersecting the first direction, the first and second pillar patterns being alternately arranged in the first and second directions, and a background pattern on the substrate, the background pattern being peripheral with respect to the plurality of first and second pillar patterns, and an outer surface of the background pattern tracing a profile defined by outermost of the plurality of first and second pillar patterns.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device according to some exemplary embodiments will be described with reference to FIGS. 1 to 4.

Figure 1:
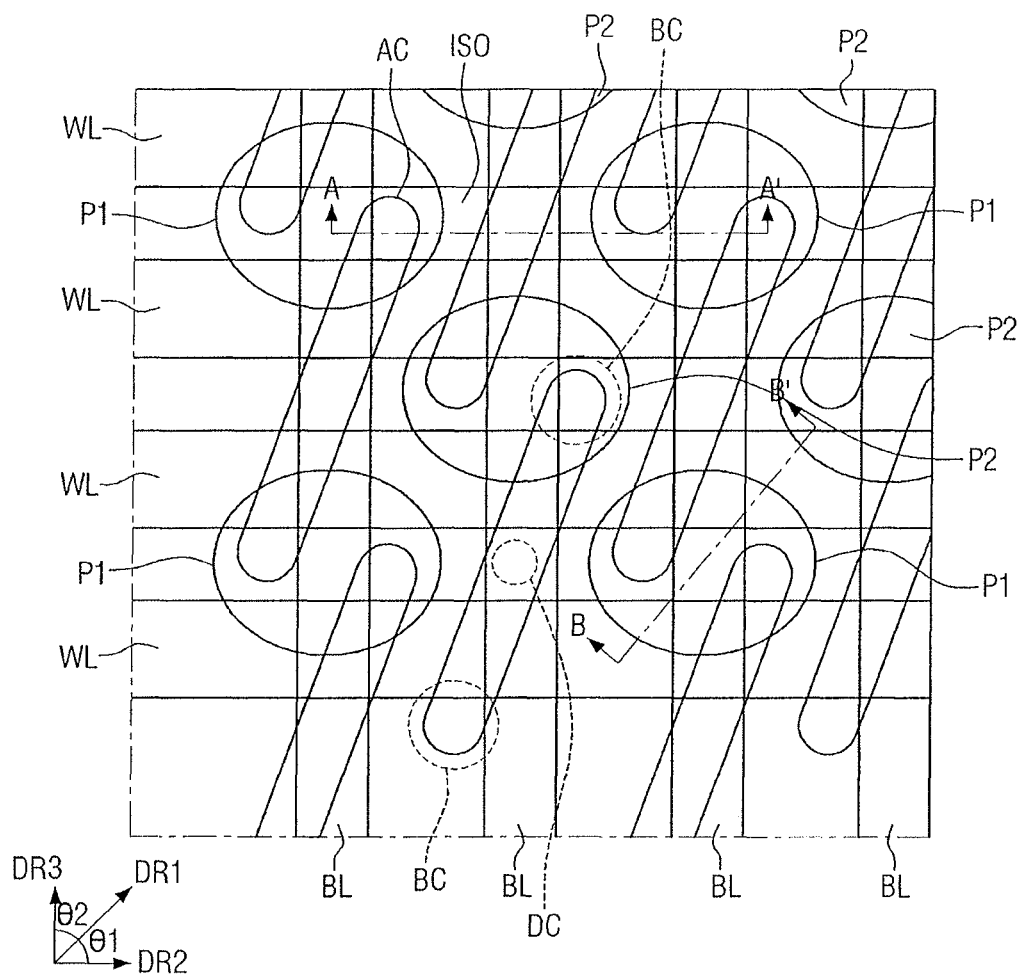
FIG. 1 illustrates a layout diagram of a semiconductor device according to some exemplary embodiments.
Figure 2:
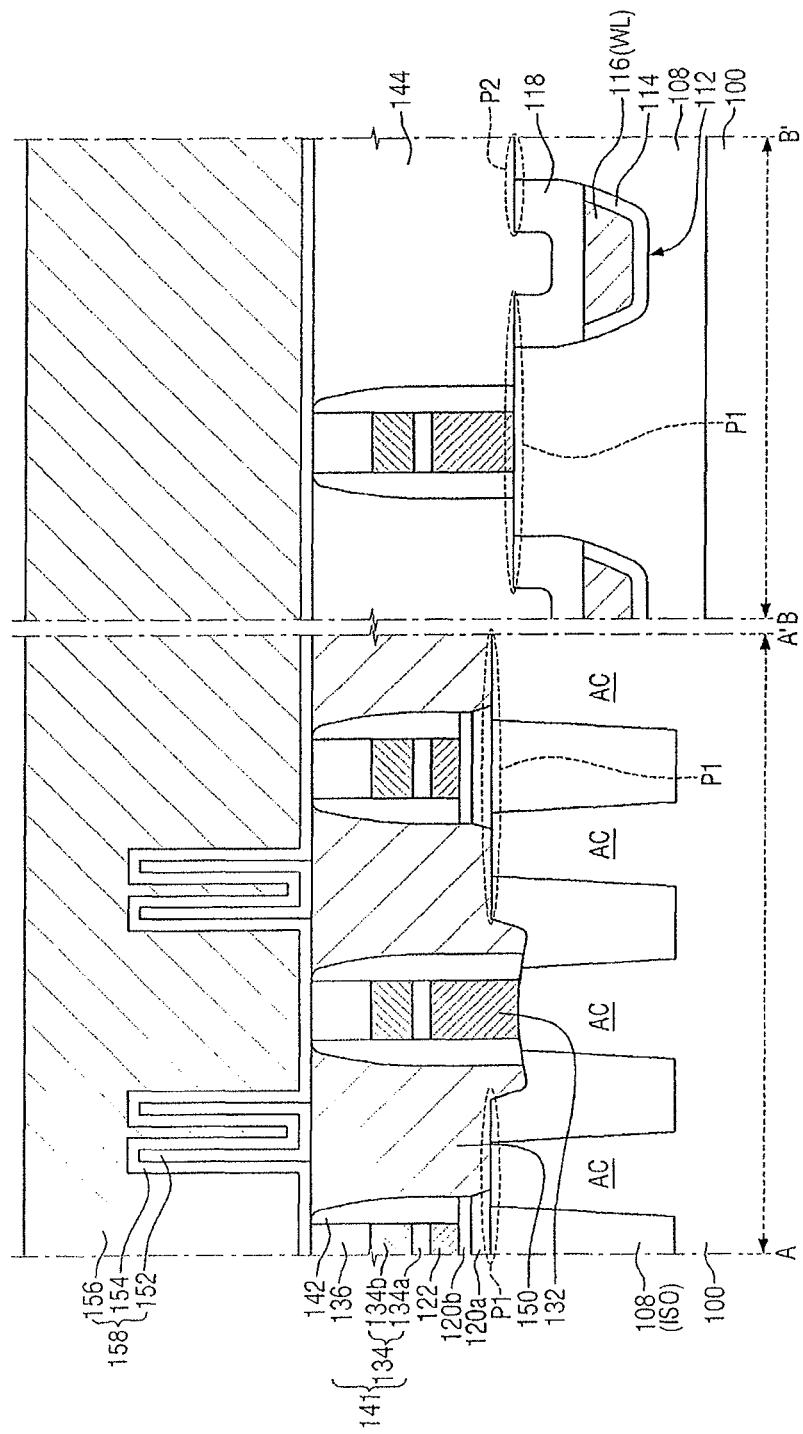
FIG. 2 illustrates a cross sectional view taken along lines A-A' and B-B' of FIG. 1.
Figure 3:
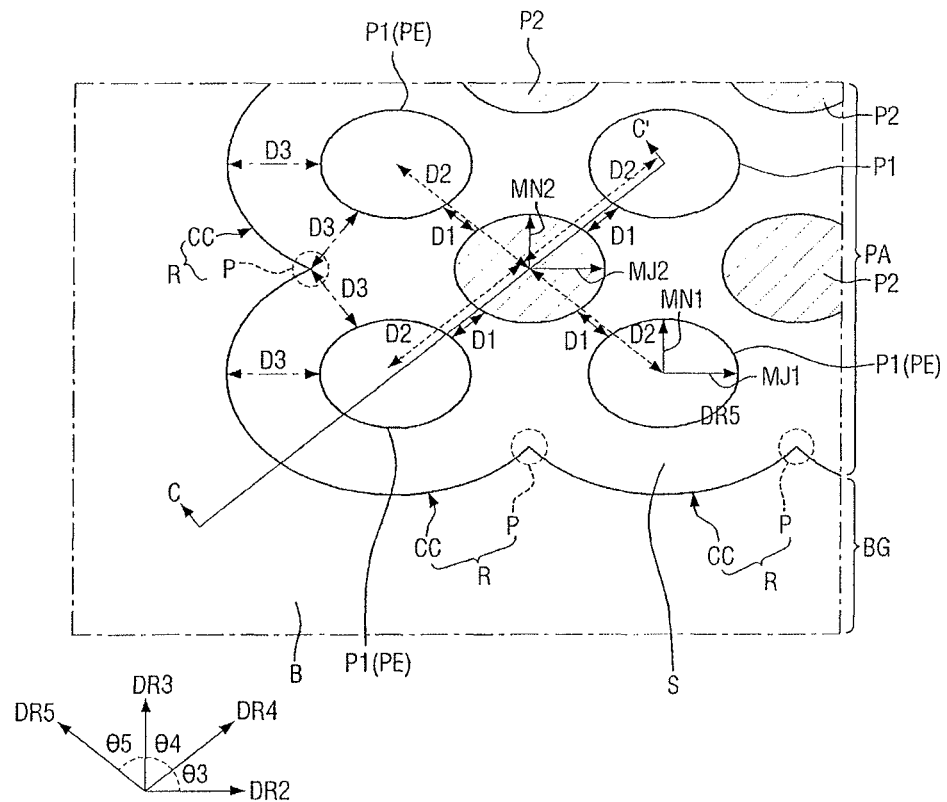
FIG. 3 illustrates a partial top view of the semiconductor device of FIG. 1 according to some exemplary embodiments.
Figure 4:
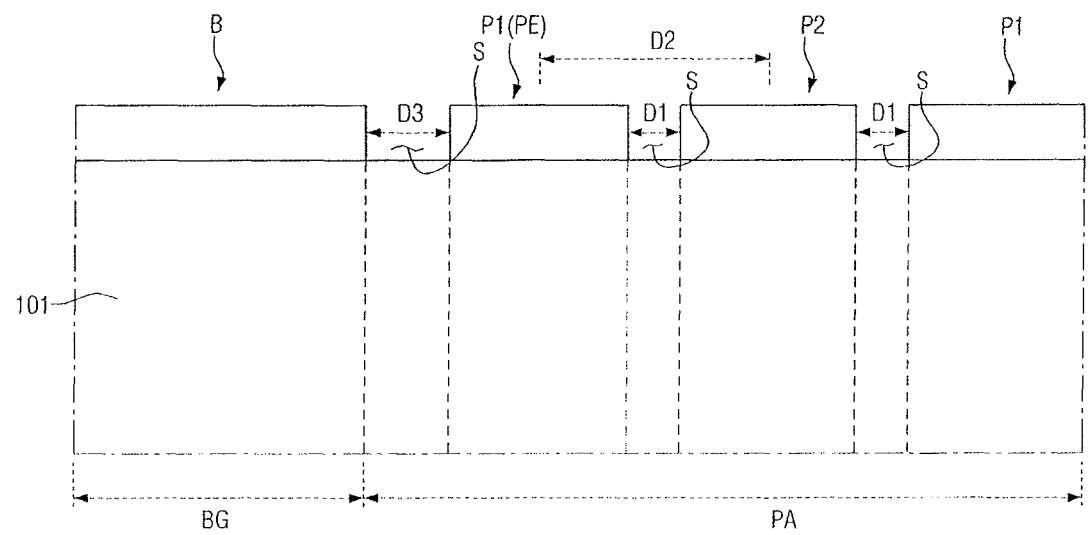
FIG. 4 illustrates a cross sectional view taken along line C-C' of FIG. 3.

FIG. 1 is a layout diagram provided to explain a semiconductor device according to some exemplary embodiments, and FIG. 2 is a cross sectional view along lines A-A' and B-B' of FIG. 1. FIG. 3 is a partial top view provided to explain the semiconductor device of FIG. 1 according to some exemplary embodiments, and FIG. 4 is a cross sectional view taken along line C-C' of FIG. 3.

Referring to FIGS. 1 to 4, a semiconductor device according to some exemplary embodiments may include a substrate 100, an active region AC, a device isolating region ISO, a word line WL, a bit line BL, a first pillar pattern P1, and a second pillar pattern P2.

The substrate 100 may be, e.g., a bulk silicon or a silicon-on-insulator (SOI). Alternatively, the substrate 100 may be a silicon substrate, or may include other materials, e.g., silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The active region AC is defined as the device isolating region ISO is formed in the substrate 100. The active region AC may have a shape of an isolated island having a first direction DR1 as a length direction. To explain the above in detail, the active region AC is formed by extending in the first direction DR1, a gate electrode (i.e., word line) is formed by extending in a second direction DR2 at a first acute angle ($\theta 1$) with the first direction DR1, and the bit line BL is formed by extending in a third direction DR3 at a second acute angle ($\theta 2$) with the first direction DR1.

As used herein, the "angle" in the statement "certain direction is at a predetermined angle with a certain different direction" refers to a smaller angle of the two angles formed between the two intersecting directions. For example, it refers to 60°, when 120° and 60° are the angles that can be made between two intersecting directions. Accordingly, as illustrated in FIG. 1, the angle between the first direction DR1 and the second direction DR2 is $\theta 1$, and the angle between the first direction DR1 and the third direction DR3 is $\theta 2$.

As described above, angles $\theta 1$ and/or $\theta 2$ are made acute angles because it is necessary to ensure maximum distance between a bit line contact 132 connecting the active region AC with the bit line BL, and a storage node contact 150 connecting the active region AC with storage node. For example, $\theta 1$ and $\theta 2$ may each be 45° and 45°, or 30° and 60°, or 60° and 30°, but not limited thereto.

Each active region AC may include a first contact region DC on a top surface of a center portion, and a second contact region BC on the top surface of opposing edges, respectively. For example, as illustrated in FIG. 1, the first contact region DC may be between two second contact regions BC on the top surface of each active region AC. That is, the first contact region DC becomes a region to electrically connect with the bit line BL, and the second contact region BC becomes a region to electrically connect with a capacitor 158, i.e., with the storage node. Each of the active regions AC neighboring in the second direction may be formed such that the second contact regions BC are disposed adjacent to each other. The first contact region DC and the second contact region BC in each active region AC do not overlap each other, and each has an isolated region.

A device isolating insulating film 108 may be formed in the device isolating region ISO. The device isolating insulating film 108 may include silicon oxide. Alternatively, the device isolating insulating film 108 may have a structure in which at least one or more layers of silicon oxide and silicon nitride are stacked respectively. An inner width of the device isolating region ISO may vary depending on a location where the device isolating region ISO is formed, and the stack structure of the device isolating insulating film 108 filling an interior of the device isolating region ISO may vary depending on the inner width of the device isolating region ISO.

A gate trench 112 may be formed by partially etching the substrate 100 and the device isolating insulating film 108 in the active region AC. The gate trench 112 may have a shape of a line extending, e.g., continuously, in the second direction DR2. There may be two gate trenches 112 disposed in, e.g., intersecting, one isolated active region AC. That is, two gate trenches 112 may be disposed in each active region AC while being spaced apart, e.g., along the third direction D3, and in parallel with each other.

The gate trench 112 may have several shapes. For example, as illustrated, the gate trench 112 may have a shape in which a connecting portion between a bottom surface and a sidewall is round. Alternatively, the gate trench 112 may have a shape in which a sidewall is inclined at a predetermined angle.

A gate insulating film 114 may be formed along a portion of the sidewall and a lower surface of the gate trench 112. The gate insulating film 114 may be formed by thermal oxidation process or chemical vapor deposition process, but is not limited thereto.

For example, the gate insulating film 114 may include silicon oxide, silicon nitride, or silicon oxynitride, or a high-k dielectric material. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

A gate electrode 116 may fill a portion of the gate trench 112. The gate electrode 116 may be formed on the gate insulating film 114 within the gate trench 112. The gate electrode 116 may be formed by burying at least a portion of the gate trench 112 in which the second gate insulating film 114 is formed. That is, the gate electrode 116 may be in a recessed shape.

The gate electrode 116 may be a stack structure of a barrier metal and a fill metal. The barrier metal may include at least one of, e.g., titanium, titanium nitride, tantalum, and tantalum nitride. Such material may be stacked alone, or alternatively, two or more of such materials may be stacked. The fill metal may include, e.g., tungsten or a conductive material such as polysilicon, and so on. However, exemplary embodiments are not limited to the example given above.

The gate electrode 116 may be the word line WL in FIG. 1. That is, the gate electrode 116 may extend along the gate trench 112 and in the second direction DR2.

A capping film 118 may, e.g., entirely, fill the gate trench 112. The capping film 118 may be formed on the gate electrode 116. An upper surface of the capping film 118 may be in a same plane as an upper surface of the substrate 100 or the device isolating insulating film 108. However, exemplary embodiments are not limited to the example given above. The capping film 118 may include at least one of, e.g., silicon oxide, silicon nitride, and silicon oxynitride.

The first contact region DC and a second contact region BC of a same active region AC may be formed on both side surfaces of the gate electrode 116, e.g., on both sides of the word line WL as illustrated in FIG. 1. A source/drain may be formed in the first contact region DC and the second contact region BC.

The bit line contact 132 may be formed on the first contact region DC, e.g., of each bit line BL, to be electrically connected with the bit line BL. The bit line contact 132 may include an electrically conductive material. For example, the bit line contact 132 may include at least one of polysilicon, metal silicide compound, conductive metal nitride, and metal, but not limited thereto.

The bit line BL may extend along the third direction D3 to be perpendicular to the word line WL, and to include a stack structure, i.e., a bit line structure 141. The bit line structure 141 may include a second conductive film 134, a hard mask pattern 136, and an insulating spacer 142 stacked on a pad insulating film 120a, an etch stop film 120b, and a first conductive film 122.

The pad insulating film 120a may include, e.g., silicon oxide. The pad insulating film 120a may electrically insulate from the underlying structure, e.g., at a lowermost portion of the bit line structure 141. The pad insulating film 120a may not be formed in the first contact region DC where the bit line contact 132 is formed, e.g., the pad insulating film 120a may be formed in a portion of the bit line BL that does not overlap the first contact region DC. The pad insulating film 120a may include, e.g., silicon oxide.

The etch stop film 120b may be formed, e.g., directly, on the pad insulating film 120a. The etch stop film 120b may be formed from an insulating material having a high etch selectivity with respect to the pad insulating film 120a. The etch stop film 120b may include, e.g., silicon nitride. The etch stop film 120b may play a role of a termination point film to stop etching in the lower portion during formation of the bit line BL.

The first conductive film 122 may be formed, e.g., directly, on the etch stop film 120b. The first conductive film 122 includes a material that can be easily etched by an etch process. For example, the first conductive film 122 may include polysilicon. The first conductive film 122 may not be formed on a portion where the bit line contact 132 is formed. At this time, upper surfaces of the first conductive film 122 and the bit line contact 132 are formed at an equal height, e.g., with respect to a bottom of the substrate 100, to support the bit line BL extending to the same height. For example, as illustrated in FIG. 2, upper surfaces of the first conductive film 122 and the bit line contact 132 may be level, e.g., coplanar.

The second conductive film 134 may be formed on the first conductive film 122, e.g., and on the bit line contact 132. The second conductive film 134 may have a lower resistance than the first conductive film 122. The second conductive film 134 may include a barrier metal film 134a and a metal film 134b. The barrier metal film 134a may be formed on the first conductive film 122, and the metal film 134b may be formed on the barrier metal film 134a. The barrier metal film 134a may include, e.g., titanium, titanium nitride, tantalum, and tantalum nitride. These may be used alone, or two or more may be stacked. The metal film 134b may include, e.g., tungsten, but not limited thereto.

The hard mask pattern 136 may be formed, e.g., directly, on the second conductive film 134. The hard mask pattern 136 may be formed by extending in the third direction DR3 for patterning of the line shape of the bit line BL. In detail, the hard mask pattern 136 may be used as a mask to pattern line shapes of the first conductive film 122 and the second conductive film 134. The hard mask pattern 136 may include, e.g., silicon nitride.

The insulating spacer 142 may be formed on a side surface of the bit line BL. In detail, the insulating spacer 142 may be formed on the side surfaces of the first conductive film 122, the second conductive film 134, and the hard mask pattern 136 of the bit line BL. In the first contact region DC, the insulating spacer 142 may also be formed on a side surface of the bit line contact 132. At this time, the insulating spacer 142 may include an air spacer.

An interlayer insulating film 144 may fill a portion where the bit line BL is not formed. An upper surface of the interlayer insulating film 144 may be in the same plane as the upper surface of the bit line BL, i.e., as the upper surface of the hard mask pattern 136.

The storage node contact 150 may be formed through the interlayer insulating film 144. The storage node contact 150 may be formed on the second contact region BC of the active region AC. The storage node contact 150 may electrically connect the second contact region BC with the capacitor 158. The storage node contact 150 may include a conductive material, e.g., polysilicon.

The capacitor 158 may be in contact with an upper portion of the storage node contact 150. The capacitor 158 may be a cylinder type or a stack type. The capacitor 158 may have a structure in which a lower electrode 152, a dielectric film 154, and an upper electrode 156 are stacked in sequence.

The lower electrode 152 may be a film formed from a conductive material. The lower electrode 152 may be formed of, e.g., TIN, TiAlN, TAN, W, WN, Ru, $RuO_2$, $SrRuO_3$, Ir, $IrO_2$, Pt, or a combination thereof, but is not limited thereto. The lower electrode 152 may be formed with a method such as, e.g., physical vapor deposition, chemical vapor deposition (hereinbelow, "CVD"), atomic layer deposition (hereinbelow, "ALD"), and so on.

The dielectric film 154 is formed on the lower electrode 152. Although the dielectric film 154 is illustrated as one single layer in the drawings, exemplary embodiments are not limited thereto. For example, the dielectric film 154 may be formed of a metal nitride film and a metal oxide film stacked thereon, in which each of the films may be formed by ALD. Further, the dielectric film 154 is not limited to two layers, but may be formed of three or more layers of film as need arises.

The dielectric film 154 may be a film having a high dielectric constant. For example, the dielectric film 154 may be formed of one single film, e.g., at least one of $ZrO_2$ film, $HfO_2$ film, and $Ta_2O_3$ film, or a combination of these films, but is not limited thereto. Alternatively, the dielectric film 154 may additionally include aluminum nitride film (AlN), boron nitride film (BN), zirconium nitride film ($Zr_3N_4$), hafnium nitride film ($Hf_3N_4$), and so on.

The upper electrode 156 is formed on the dielectric film 154 and in contact with the dielectric film 154. The upper electrode 156 may include conductive metal nitride, e.g., titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN), and manganese nitride ($Mn_4N$), for example.

The first pillar pattern P1 and the second pillar pattern P2 may not overlap the first contact region DC, but may overlap the second contact region BC. That is, the first pillar pattern P1 and the second pillar pattern P2 may overlap opposing ends of the active region AC in the length direction, and may not overlap the center portion of the active region AC.

The first pillar pattern P1 and the second pillar pattern P2 may be formed, while overlapping the active region AC and the device isolating region ISO. Further, the first pillar pattern P1 and the second pillar pattern P2 may also overlap the gate trench 112 in which the capping film 118 is formed. Further, the first pillar pattern P1 and the second pillar pattern P2 may also overlap the bit line BL in a horizontal direction, e.g., portions of the first and second pillar patterns P1 and P2 may extend in parallel to a portion of the bit line contact 132 to overlap each other in a horizontal direction. That is, the first pillar pattern P1 and the second pillar pattern P2 may overlap a lower structure of a semiconductor device according to some exemplary embodiments.

In the semiconductor device according to some exemplary embodiments, an open region, i.e., a region where the first pillar pattern P1 and the second pillar pattern P2 are not formed, is in contact with the first contact region DC, thus allowing very efficient introduction of etching gas to form the bit line contact 132 and the bit line BL. Accordingly, success rate of the etch process to pattern the bit line contact 132 and the bit line BL increases, thus enhancing operating characteristics of the semiconductor device.

Referring to FIGS. 3 and 4, the first pillar patterns P1 and the second pillar patterns P2 may be aligned in an array configuration with each other. That is, the first pillar patterns P1 and the second pillar patterns P2 may form a pillar array pattern. The lower structures formed on the substrate 100 are not illustrated in FIG. 4, but instead referred to as a "lower region 101", e.g., the pillar array pattern of the first and second pillar patterns P1 and P2 extends above the lower region 101 (dashed structure of P1 and P2 in FIG. 2 merely illustrate an overlap region rather than the actual pillar patterns).

Referring to FIG. 4, the substrate 100 may include an array region PA, and a background region BG. The first pillar patterns P1 and the second pillar patterns P2 may be formed in the array region PA. The first pillar patterns P1 and the second pillar patterns P2 may not be formed in the background region BG, but a background pattern B may be formed thereon.

Referring to FIG. 3, the first pillar patterns P1 and the second pillar patterns P2 may be alternately disposed with each other in a fourth direction DR4 and a fifth direction DR5. For example, as further illustrated in FIG. 3, the rows of the first patterns P1 may be horizontally offset with respect to the rows of the second patterns P2 to define a zigzag pattern, as viewed in a plan view. At this time, the fourth direction DR4 may make a third acute angle (O3) and a fourth acute angle (O4) with the second direction DR2 and the third direction DR3, respectively. The fifth direction DR5 may be a direction intersecting the fourth direction DR4. The fifth direction may make a fifth acute angle (O5) with the third direction DR3.

The first pillar pattern P1 and the second pillar pattern P2 are alternately disposed with each other in two directions, and therefore, each pattern and a pattern most adjacent thereto may be different patterns from each other. That is, the patterns most adjacent to the first pillar pattern P1 may be four second pillar patterns P2 adjacent in the fourth and fifth direction D4 and D5, and the patterns most adjacent to the second pillar pattern P2 may be four first pillar patterns P1 adjacent in the fourth and fifth direction D4 and D5. Patterns at a periphery of the array region PA may be adjacent to the background pattern B, e.g., rather than to the pillar pattern. The first pillar pattern P1 and the second pillar pattern P2 may be in a diagonal grid with each other, e.g., centers of the first pillar pattern P1 and the second pillar pattern P2 may be define a diagonal grid.

Distances between the first pillar patterns P1 and the second pillar patterns P2 that are adjacent to each other may be equal. Specifically, distances D2 between centers of the first pillar patterns P1 and the second pillar patterns P2 adjacent to each other in the fourth and fifth direction D4 and D5 may be equal. The distance D2 between centers of the first pillar pattern P1 and the second pillar pattern P2 that are adjacent to each other may be, e.g., about 20 nm to about 80 nm. This may be a result of increasing the integration density by using double patterning processes.

Furthermore, distances D1 between side surfaces of the first pillar patterns P1 and the second pillar patterns P2 may also be equal for respective patterns, e.g., distances D1 refer to distances between surfaces of adjacent pillar patterns facing each other (FIG. 3). It is noted that the concept "equal" includes the possibility of a fine stepped portion that may occur according to etch process, and so on.

The heights of the first pillar pattern P1 and the second pillar pattern P2 may be equal, e.g., relative to a bottom of the substrate 100. The horizontal sections of the first pillar pattern P1 and the second pillar pattern P2 may be different from each other, e.g., shapes and/or sizes of the horizontal cross-sections of the first pillar patterns P1 may be different from those of the second pillar patterns P2 as viewed in a plan view. The side surfaces of the first pillar pattern P1 and the second pillar pattern P2 may have a rounded shape. That is, the side surfaces of the first pillar pattern P1 and the second pillar pattern P2 may not have an edge, e.g., the side surfaces of the first pillar patterns P1 and the second pillar patterns P2 may curve to define circular or elliptical shapes as seen in a plan view in FIG. 1. That is, the slopes of the horizontal circumferences of the first pillar pattern P1 and the second pillar pattern P2 may be continuous.

The horizontal sections of the first pillar pattern P1 and the second pillar pattern P2 may be circular or elliptical. In this case, at least one of long radius and short radius of each of the first pillar pattern P1 and the second pillar pattern P2 may be different. That is, referring to FIG. 3, a first long radius MJ1 and a first short radius MN1 of the first pillar pattern P1 may each be different from a second long radius MJ2 and a second short radius MN2 of the second pillar pattern P2. Alternatively, the first long radius MJ1 of the first pillar pattern P1 and the second long radius MJ2 of the second pillar pattern P2 may be equal to each other, and the first short radius MN1 of the first pillar pattern P1 and the second short radius MN2 of the second pillar pattern P2 may be different from each other. Alternatively, the first long radius MJ1 of the first pillar pattern P1 and the second long radius MJ2 of the second pillar pattern P2 may be different from each other, and the first short radius MN1 of the first pillar pattern P1 and the second short radius MN2 of the second pillar pattern P2 may be equal to each other. However, the above examples are provided only for illustrative purpose, and exemplary embodiments are not limited thereto.

The array region PA may include a spacer region S between the first pillar pattern P1 and the second pillar pattern P2. The spacer region S may refer to a space between the first pillar pattern P1 and the second pillar pattern P2. Further, the spacer region S may also be formed between the background region BG and peripheral pillar patterns PE positioned at a periphery among the first pillar patterns P1 and the second pillar patterns P2.

The spacer region S may have a lower upper surface than the first pillar pattern P1 and the second pillar pattern P2 (FIG. 4). The upper surfaces of the first pillar pattern P1 and the second pillar pattern P2 may have an equal height, e.g., the upper surfaces of the first pillar pattern P1 and the second pillar pattern P2 may be level with each other. Accordingly, irrespective of the first pillar pattern P1 and the second pillar pattern P2, the array region PA may have upper surface of two heights, e.g., due to the lower spacer region S.

As illustrated in FIG. 4, the background pattern B may be formed in the background region BG. The background pattern B may entirely fill the background region BG. The background region BG may be spaced apart from the peripheral pillar patterns PE among the first pillar patterns P1 and the second pillar patterns P2 by a predetermined distance D3. In this case, the predetermined distance D3 may be greater than the distance D1 between the side surfaces of the first pillar pattern P1 and the second pillar pattern P2.

Referring to FIG. 3, the background pattern B may include an uneven portion R at a boundary with the array region PA, e.g., an interface between the background pattern B and the array region PA may be nonlinear to include the uneven portion R. The uneven portion R may include a concave portion CC and a protruding portion P.

The concave portion CC may be formed to be concave in a direction from the array region PA to the background region BG. The concave portion CC may be formed in a shape conformal to a surface of the peripheral pillar pattern PE, e.g., the concave portion CC may curve to trace a profile of a surface of the peripheral pillar pattern PE adjacent thereto, while being spaced apart from the peripheral pillar pattern PE by the predetermined distance D3.

The protruding portion P may be formed at a point where the concave portion CC meets, e.g., contacts, an adjacent concave portion CC. The protruding portion P may be at an equal distance D3 to the two adjacent peripheral pillar patterns PE. In this case, the distance D3 may be equal to a distance D3 by which the concave portion CC is spaced apart from the peripheral pillar pattern PE. The slopes of the protruding portion P on opposing side surfaces may be equal in absolute values, but may have different signs from each other.

The semiconductor device according to some exemplary embodiments does not include a dummy pillar pattern in the background region BG, and includes the background pattern B spaced apart by the predetermined distance D3. A device with such background pattern B can minimize waste of area by maximizing the area of the array region PA, thus allowing the semiconductor device to have a maximized capacity. Furthermore, integration density can be enhanced, as the pillar pattern in the array region PE is formed with a shorter pitch than the limit allowed by the resolution of the photo apparatus.

Hereinbelow, a semiconductor device according to some exemplary embodiments will be described with reference to FIG. 5. Elements or operations overlapping with some exemplary embodiments described above will be mentioned as briefly as possible or omitted for the sake of brevity.

Figure 5:
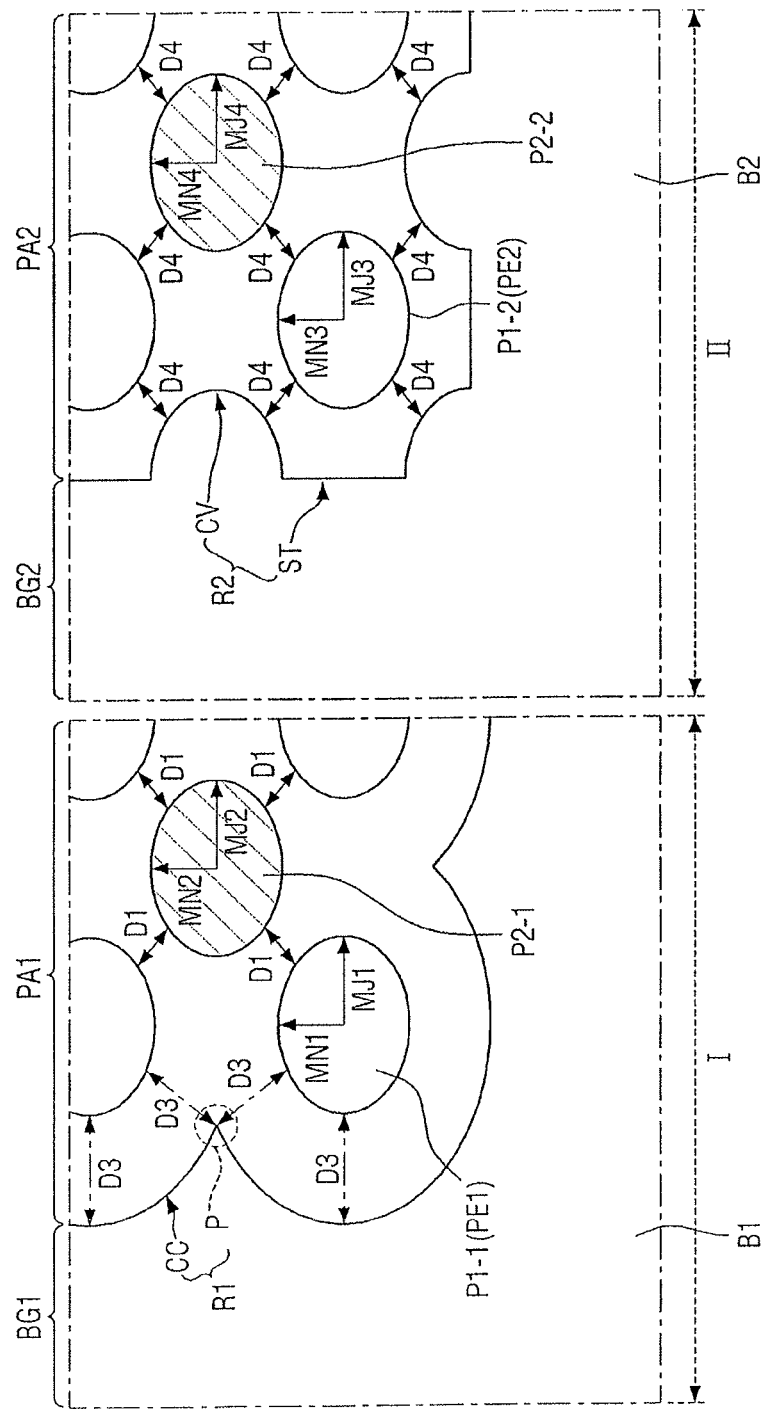
FIG. 5 illustrates a partial top view of a semiconductor device according to some exemplary embodiments.

FIG. 5 is a partial top view provided to explain a semiconductor device according to some exemplary embodiments.

Referring to FIG. 5, in a semiconductor device according to some exemplary embodiments, the substrate 100 may include a first region I and a second region II. The first region I and the second region II may be the regions adjacent to each other, or regions spaced apart from each other.

The first region I may include a semiconductor device according to some exemplary embodiments described previously with reference to FIGS. 1 to 4. That is, the first region I may include a first array region PA1 and a first background region BG1. The first pillar pattern P1-1 and the second pillar pattern P2-1 may be formed on the first array region PA1. The first background pattern B1 may be formed on the first background region BG1. The first background pattern B1 may include a first uneven portion R1.

The second region II may include a second array region PA2 and a second background region BG2. A third pillar pattern P1-2 and a fourth pillar pattern P2-2 may be formed on the second array region PA2.

In detail, the third pillar pattern and the fourth pillar pattern are alternately disposed with each other in two directions, and therefore, each pattern may be different from a most adjacent pattern thereto. That is, four fourth pillar patterns may be the patterns most adjacent to the third pillar pattern, and four third pillar patterns may be the patterns most adjacent to the fourth pillar pattern. Patterns at a periphery of the second array region PA2 may be adjacent to the second background pattern B2, rather than to the pillar pattern.

Distances between the third pillar patterns and the fourth pillar patterns that are adjacent to each other may be equal. In detail, distances between centers of the third pillar patterns and the fourth pillar patterns adjacent to each other may be equal. Distances between centers of the third pillar patterns and the fourth pillar patterns adjacent to each other may be equal to the distances between centers of the first pillar patterns P1 and the second pillar patterns P2. However, exemplary embodiments are not limited thereto, and accordingly, distances between centers of the third pillar patterns and the fourth pillar patterns may be different from the distances between centers of the first pillar patterns P1 and the second pillar patterns P2.

Furthermore, distances D4 between side surfaces of the third pillar patterns and the fourth pillar patterns may also be equal for respective patterns. Note that the concept "equal" includes the possibility of a fine stepped portion that may occur according to etch process, and so on.

The heights of the third pillar pattern and the fourth pillar pattern may be equal. The horizontal sections of the third pillar patterns and the fourth pillar patterns may be different from each other. The side surfaces of the third pillar pattern and the fourth pillar patterns may have a rounded shape. That is, the side surfaces of the third pillar pattern and the fourth pillar pattern may not have an edge. That is, the slopes of the horizontal circumferences of the third pillar pattern and the fourth pillar pattern may be continuous.

The horizontal sections of the third pillar pattern and the fourth pillar pattern may be circular or elliptic. In this case, at least one of a long radius and a short radius of the third pillar pattern and the fourth pillar pattern may be different. That is, a third long radius MJ3 and a third short radius MN3 of the third pillar pattern may each be different from a fourth long radius MJ4 and a fourth short radius MN4 of the fourth pillar pattern. Alternatively, that is, the third long radius MJ3 of the third pillar pattern and the fourth long radius MJ4 of the fourth pillar pattern may be equal to each other, and the third short radius MN3 of the third pillar pattern and the fourth short radius MN4 of the fourth pillar pattern may be different from each other. Alternatively, that is, the third long radius MJ3 of the third pillar pattern and the fourth long radius MJ4 of the fourth pillar pattern may be different from each other, and the third short radius MN3 of the third pillar pattern and the fourth short radius MN4 of the fourth pillar pattern may be equal to each other. However, the above examples are provided only for illustrative purpose, and exemplary embodiments are not limited thereto.

The second background pattern B2 entirely filling the second background region BG2 may include a second uneven portion R2. The second uneven portion R2 may include a convex portion CV and a straight portion ST.

In detail, referring to FIG. 5, the convex portion CV may be formed in a configuration in which a portion of the pillar pattern of the second array region PA2 is connected with the second background pattern B2. Accordingly, a distance from the second background pattern B2 to the second peripheral pillar pattern PE2 may actually be equal to the distance D4 between the third pillar pattern and the fourth pillar pattern of the second array region PA2.

The straight portion ST may be a portion that connects one convex portion CV with an adjacent convex portion CV with a straight line. Accordingly, the convex portion CV may convexly protrude with reference to the straight portion ST from the second background region BG2 in a direction of the second array region PA2.

The semiconductor device according to some exemplary embodiments may include two divided regions, and thus include two different types of background patterns. The first background pattern B1 of the first region I may increase integration density and maximize utilization of the pillar patterns. The second background pattern B2 of the second region II may be provided in consideration of a possibility that peripheral pillar patterns may be damaged, e.g., during processing. That is, by including the second background pattern B2, failures due to potential damaged pillar patterns in the second background pattern B2 may be prevented in advance.

In other words, the first background pattern B1 may be formed in the first region I to increase integration density therein, and the second background pattern B2 may be formed only in the second region II to reduce failure rate therein. That is, the background patterns of desired configurations according to characteristics of the respective regions may be used at the same time in a same device.

Hereinbelow, a semiconductor device according to some exemplary embodiments will be described with reference to FIG. 6. In the following description, description overlapped with the exemplary embodiments already provided above will not be described or described as briefly as possible for the sake of brevity.

Figure 6:
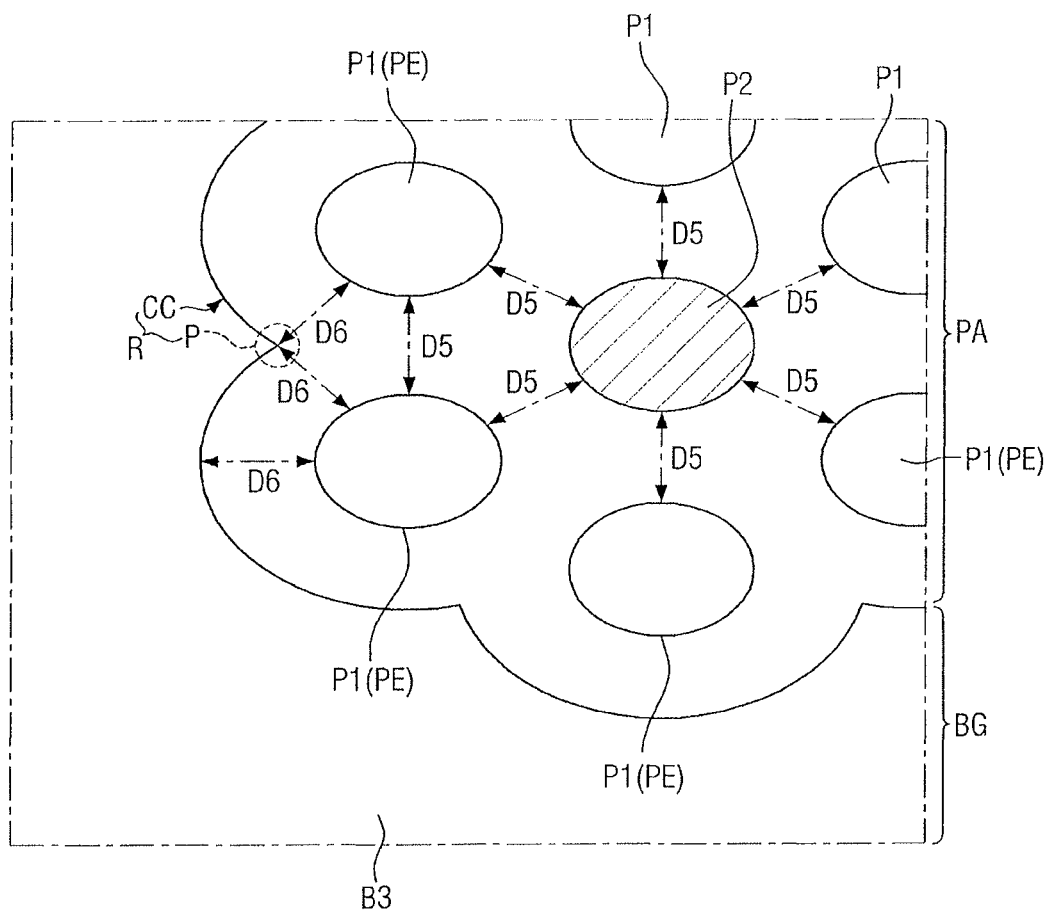
FIG. 6 illustrates a partial top view of a semiconductor device according to some exemplary embodiments.

FIG. 6 is a partial top view provided to explain a semiconductor device according to some exemplary embodiments.

Referring to FIG. 6, the semiconductor device according to some exemplary embodiments may include a pillar array pattern disposed in a honeycomb shape.

The substrate 100 may include the array region PA, and the background region BG. In detail, in the array region PA, the first pillar patterns P1 and the second pillar patterns P2 may be positioned such that the second pillar pattern P2 may be placed at a center, while six first pillar patterns P1 may be positioned at an equal distance D5 from the second pillar pattern P2. In this case, the distance D5 between adjacent first pillar patterns P1 may be equal to the distance D5 between each of the first pillar patterns P1 and the second pillar pattern P2.

A third background pattern B3 may be formed in the background region BG. The third background pattern B3 may entirely fill the background region BG. The third background pattern B3 may be formed a predetermined distance D6 apart from the peripheral pillar pattern PE. The third background pattern B3 may include the uneven portion R at a boundary with the array region PA. The uneven portion R may include the concave portion CC and the protruding portion P.

The concave portion CC may be formed to be concave in a direction oriented from the array region PA to the background region BG. The concave portion CC may be formed in a shape conformal with respect to a surface of the peripheral pillar pattern PE, while being spaced apart from the peripheral pillar pattern PE by the predetermined distance D6.

The protruding portion P may be formed at a point where one concave portion CC meets, e.g., contacts, an adjacent concave portion CC. The protruding portion P may be at an equal distance D6 from each of the two adjacent peripheral pillar patterns PE. In this case, the distance D6 may be equal to a distance D6 by which the concave portion CC is spaced apart from the peripheral pillar pattern PE.

In the semiconductor device according to some exemplary embodiments, the first pillar patterns P1 and the second pillar patterns P2 may be disposed in a honeycomb shape, e.g., pattern, in the array region PA. The honeycomb shape may be a shape that can provide the highest integration density of the pillar patterns. That is, it is possible to increase the integration density of the pillar patterns to, thus, increase the overall integration density of the semiconductor device and enhance operating characteristics.

Hereinbelow, a method for fabricating a semiconductor device according to some exemplary embodiments will be described with reference to FIGS. 3, 4 and 7A to 15. Elements or operations of the semiconductor device overlapping with those described previously will be mentioned as briefly as possible or omitted for the sake of brevity.

FIGS. 7A to 15 are views illustrating intermediate stages of fabrication, provided to explain a method for fabricating a semiconductor device according to some exemplary embodiments. FIGS. 7A to 14A are partial top views, and FIGS. 7B to 14B are cross sectional views taken along line D-D' of respective FIGS. 7A to 14A.

Figure 7A:
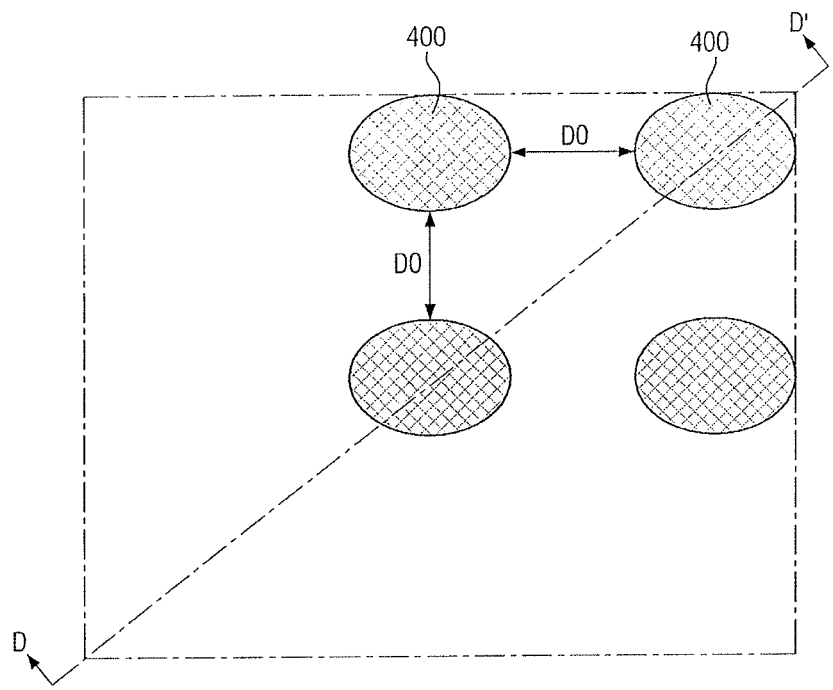
FIGS. 7A to 15 illustrate views of intermediate in a method for fabricating a semiconductor device according to some exemplary embodiments.
Figure 7B:
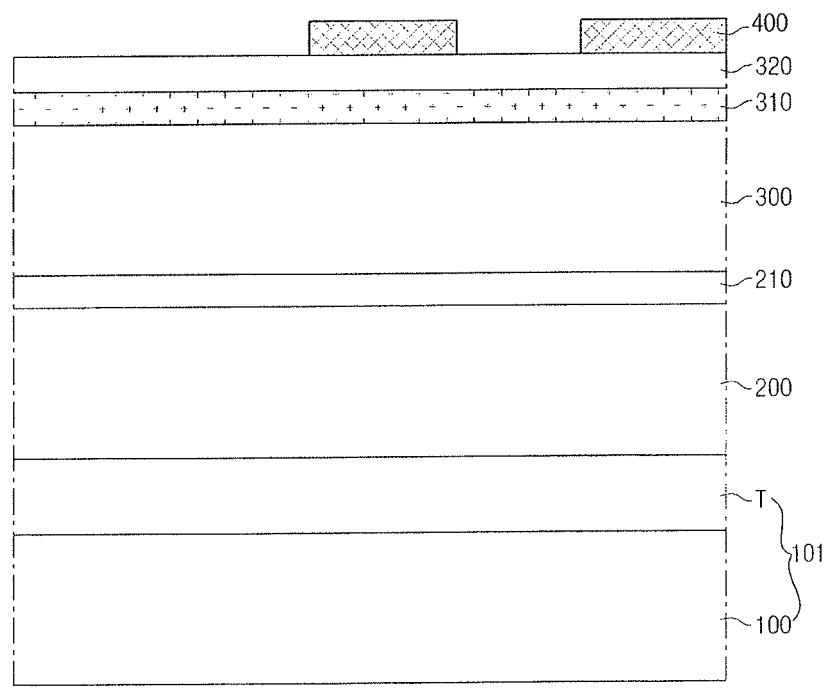

First, referring to FIGS. 7A and 7B, a stack structure to form the first pillar pattern P1 and the second pillar pattern P2 of FIGS. 3 and 4 is provided.

A target layer T patterned with the substrate 100 may include the lower structure described with reference to FIG. 2. For convenience of explanation, the lower structure is not illustrated, but instead illustrated as the lower region 101 described previously with reference to FIG. 4. On the lower region 101, first mask layers 200, 210, second mask layers 300, 310, and an anti-reflection layer 320 are stacked in a sequential order, and then a photoresist due to the conformal structure of the spacer film 500 pattern 400 is formed on the anti-reflection layer 320.

The first mask layers 200, 210, the second mask layers 300, 310, and the anti-reflection film 320 may be formed by, e.g., atomic layer deposition (ALD), chemical vapor deposition (CVD), spin coating, and so on, and baking or curing processes may be added depending on materials used.

As illustrated, the first mask layers 200, 210, and the second mask layers 300, 310 may be composed of a plurality of layers. The plurality of layers may each be formed of at least one of a silicon-containing material, e.g., silicon oxide ($SiO_x$), silicon oxynitride (SiON), silicon nitride ($Si_xN_y$), tetraethyl orthosilicate (TEOS), or polycrystalline silicon, and so on, a carbon-containing material, e.g., an amorphous carbon layer (ACL) or a spin-on hardmask (SOH), or metal. A lower layer of the plurality of layers may be formed of silicon nitride layer, for example, and the lower layer may additionally include a thin silicon oxide under the silicon nitride. An upper layer may be formed of silicon oxide. The first mask layers 200, 210, and the second mask layers 300, 310 may additionally include a polycrystalline silicon layer on the silicon oxide layer. However, exemplary embodiments are not limited to the example given above.

The anti-reflection layer 320 refers to a layer that prevents light from reflecting against an underlying layer during a photolithography process. The anti-reflection layer 320 may be formed, e.g., of a silicon oxynitride film (SiON). However, exemplary embodiments are not limited to the example given above.

The photosensitive pattern 400 may be patterned with a photolithography process. The photosensitive pattern 400 may be a photoresist used for a photolithography process. However, exemplary embodiments are not limited to the example given above. The photoresist pattern 400 may be formed in consideration of a shape of the first pillar pattern P1 to be formed later. The photoresist pattern 400 may be include portions spaced apart from each other by a predetermined distance D0 (FIG. 7A). The photoresist pattern 400 may have an elliptic or circular shape, but is not limited thereto.

Figure 8A:
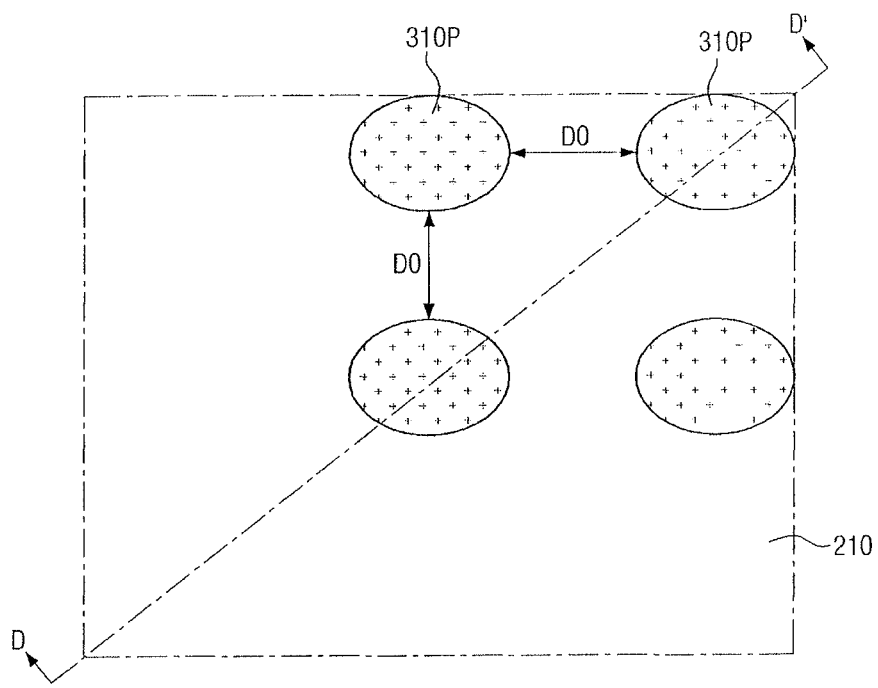
Figure 8B:
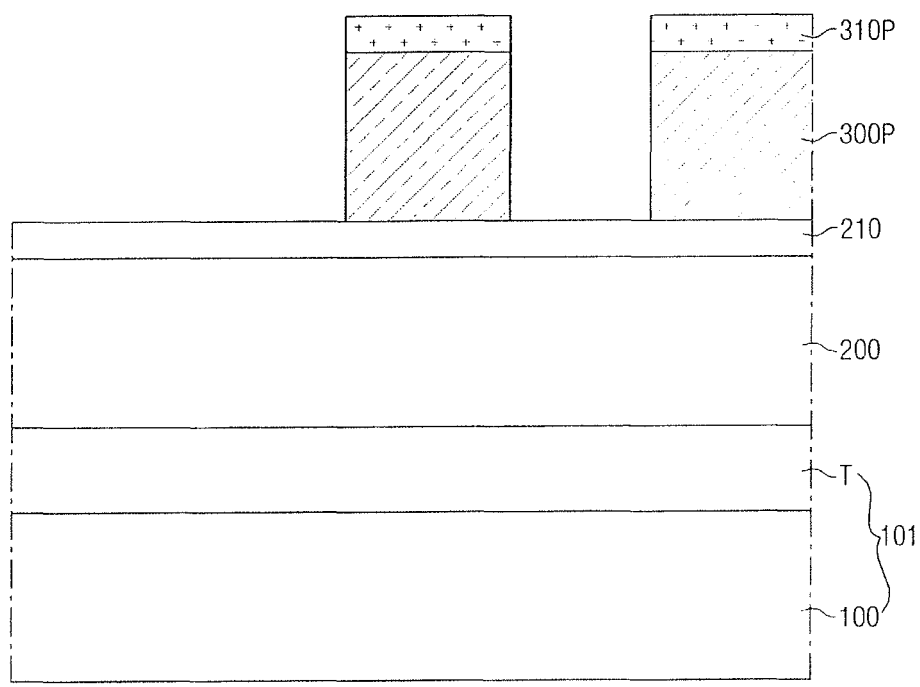

Next, referring to FIGS. 8A and 8B, the second mask layers 300, 310 are etched with the photoresist pattern 400 as a mask. That is, except for the portions where the photoresist pattern 400 are positioned, the second mask layers 300, 310 may be etched vertically with anisotropic etching so that second mask patterns 300p, 310p are formed (FIG. 8B). The photoresist pattern 400 and the anti-reflection layer 320 may be removed during the etch process, or may be entirely removed by an additional, e.g., separate, process.

The second mask patterns 300p, 310p may expose upper portions of the first mask layers 200, 210. Accordingly, referring to the top view in FIG. 8A, the upper portions of the first mask layers 200, 210 and the upper portions of the second mask patterns 300p, 310p may be exposed.

Figure 9A:
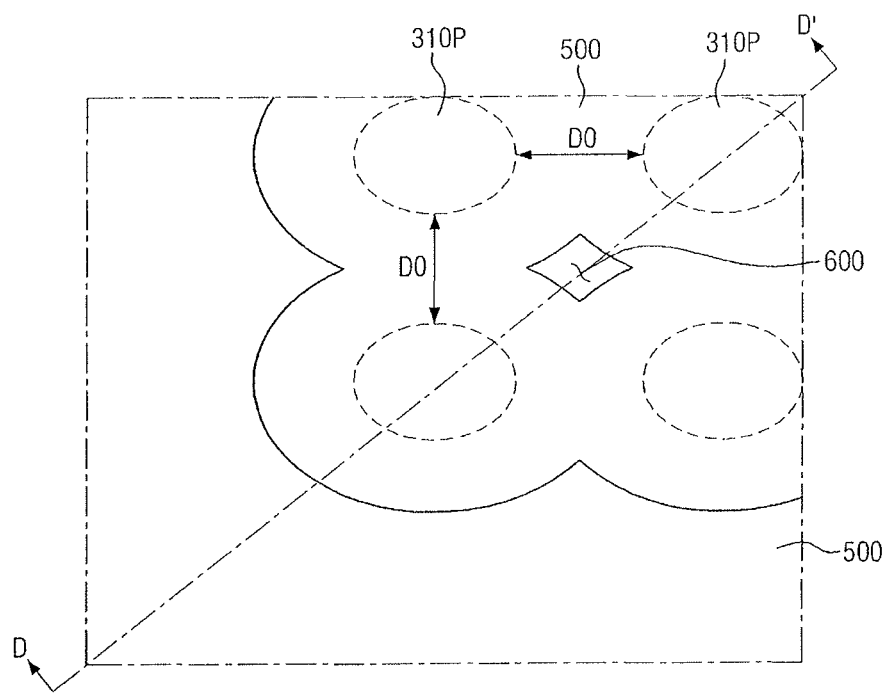
Figure 9B:
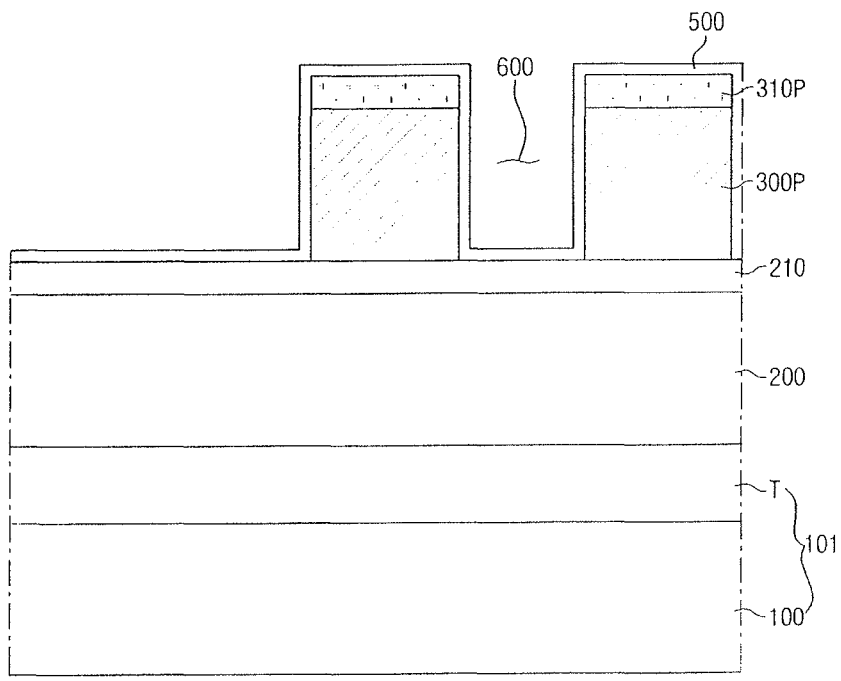

Next, referring to FIGS. 9A and 9B, a spacer film 500 may be formed on the exposed upper portions of the first mask layers 210 and the second mask patterns 310p. In detail, the spacer film 500 may overlie the upper portions 210 of the first mask layers 200, 210, and the upper portions 310p of the second mask patterns 300p, 310p. The spacer film 500 may also be formed on side surfaces of the second mask patterns 300p, 310p. Specifically, the spacer film 500 may be formed conformally along the upper surfaces and the side surfaces of the second mask patterns 300p, 310p, and the upper surfaces of the first mask layers 200, 210. For example, due to the conformal structure of the spacer film 500 along the elliptical/circular shape of the second mask patterns 300p, 310p, an outer periphery of the spacer film 500 may be curved in a plan view (FIG. 9A)

At this time, e.g., due to the conformal structure of the spacer film 500, a self-aligning groove 600 may be formed between adjacent second mask patterns 300p, 310p (FIG. 9B). For example, as illustrated in FIG. 9A, the self-aligning groove 600 may be defined in a center among four second mask patterns 300p, 310p, and may be spaced apart from the second mask patterns 300p, 310p by a predetermined distance. That is, it may be spaced apart by a thickness of the spacer film 500.

As illustrated in FIG. 9A, the self-aligning groove 600 may have a rhombus shape having a concave side, e.g., the concave side of the rhombus may be defined by the curved outer periphery of the spacer film 500 surrounding the elliptical/circular shape of the second mask patterns 300p, 310p. When the second mask patterns 300p, 310p have a honeycomb shape, a hexagon shape with concave sides may be formed rather than the rhombus shape.

Figure 10A:
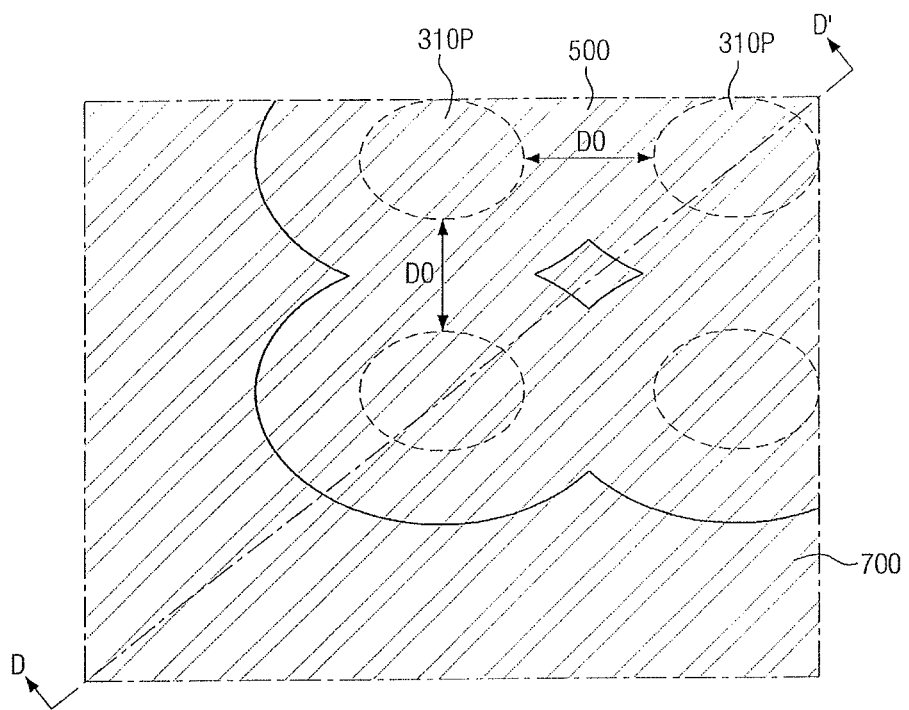
Figure 10B:
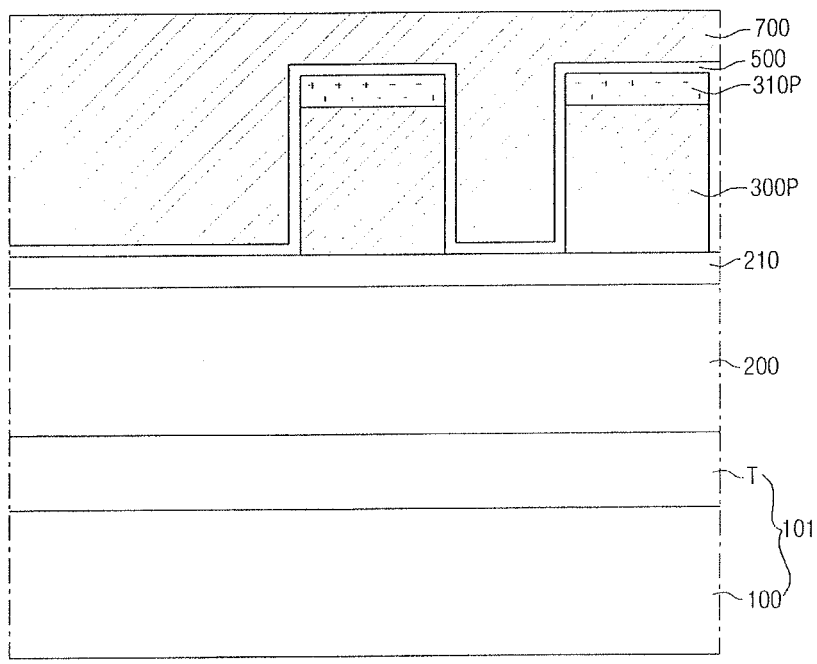

Next, referring to FIGS. 10A and 10B, a filler 700 may be formed on the spacer film 500. The filler 700 may overlie the spacer film 500. The filler 700 may entirely fill the self-aligning groove 600. An upper surface of the filler 700 may be formed higher than the upper surfaces of the second mask patterns 300p, 310p, and the spacer film 500.

Figure 11A:
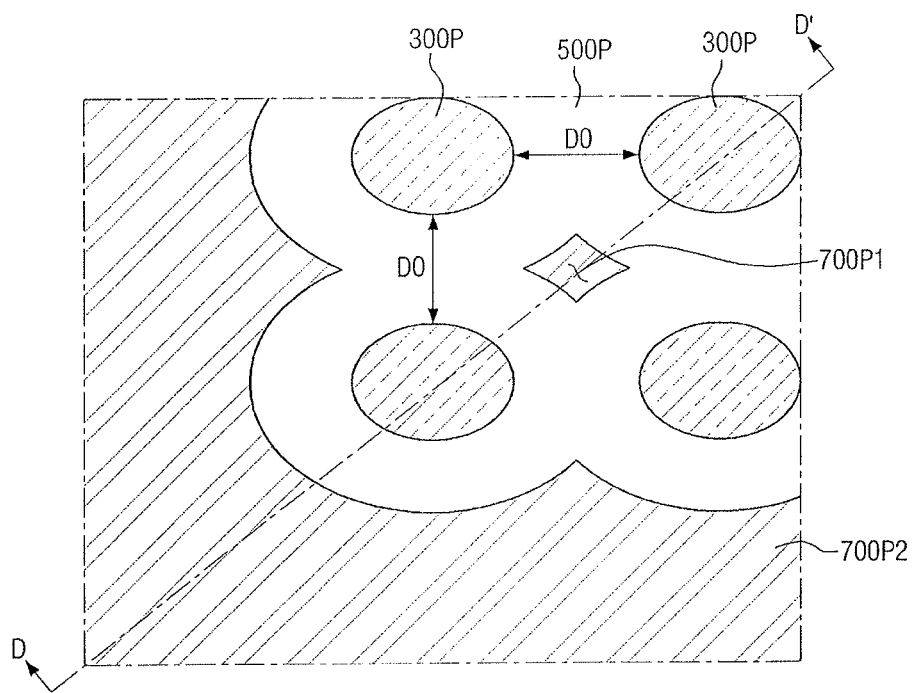
Figure 11B:
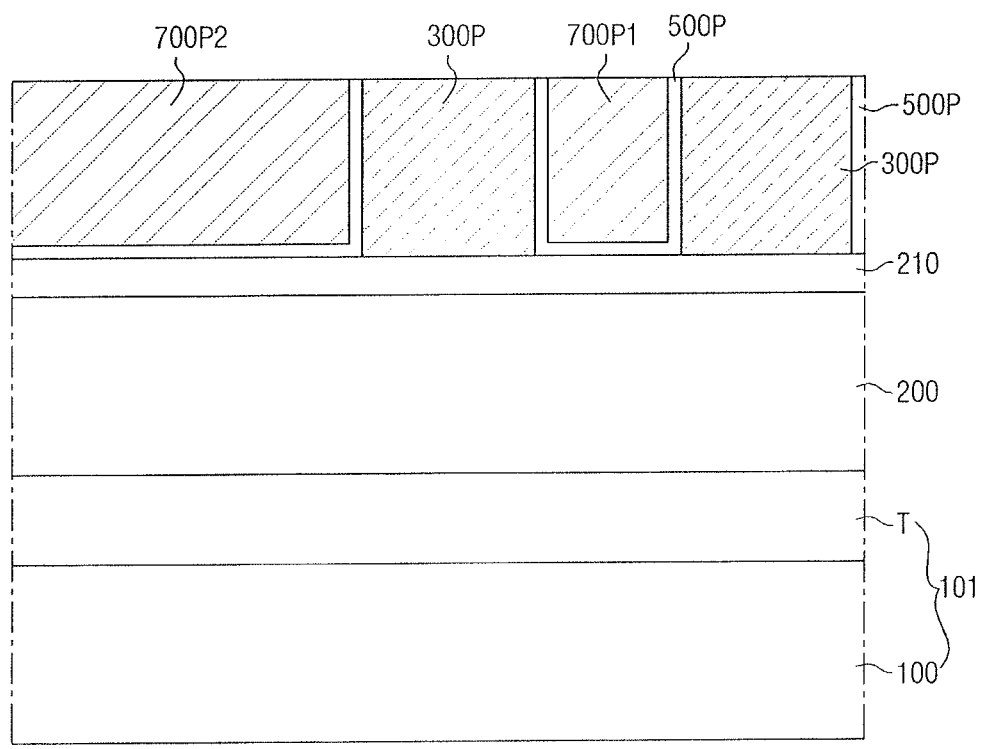

Next, referring to FIGS. 11A and 11B, a first filler pattern 700P1 and a second filler pattern 700P2 may be formed by partially removing the filler 700 and the spacer film 500, e.g., mask 310p may be removed with the spacer film 500. The process for partially removing the filler 700 and the spacer film 500 may be a chemical mechanical polish (CMP) process, or an etch back process. However, exemplary embodiments are not limited to the example given above.

The first filler pattern 700P1 may be positioned in the self-aligning groove 600, and a lower surface and a side surface of the first filler pattern 700P1 may be surrounded by the spacer pattern 500P. A lower surface and a side surface of the second filler pattern 700P2 may also be surrounded by the spacer pattern 500P. The spacer pattern 500P may include a first portion in contact with the lower surfaces of the first filler pattern 700P1 and the second filler pattern 700P2, and a second portion in contact with the side surfaces of the first filler pattern 700P1 and the second filler pattern 700P2.

Figure 12A:
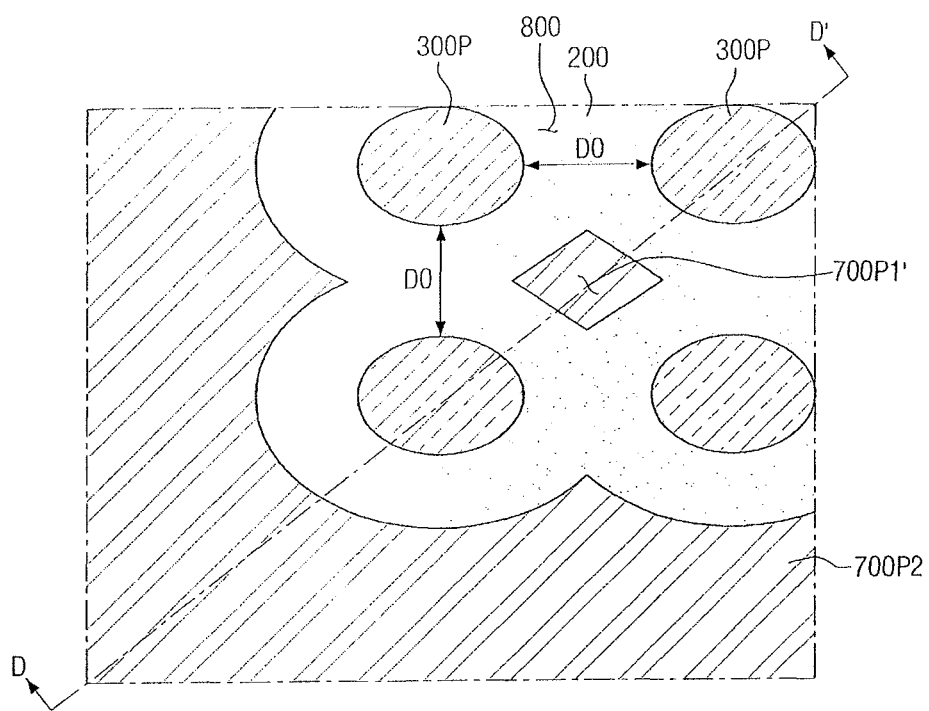
Figure 12B:
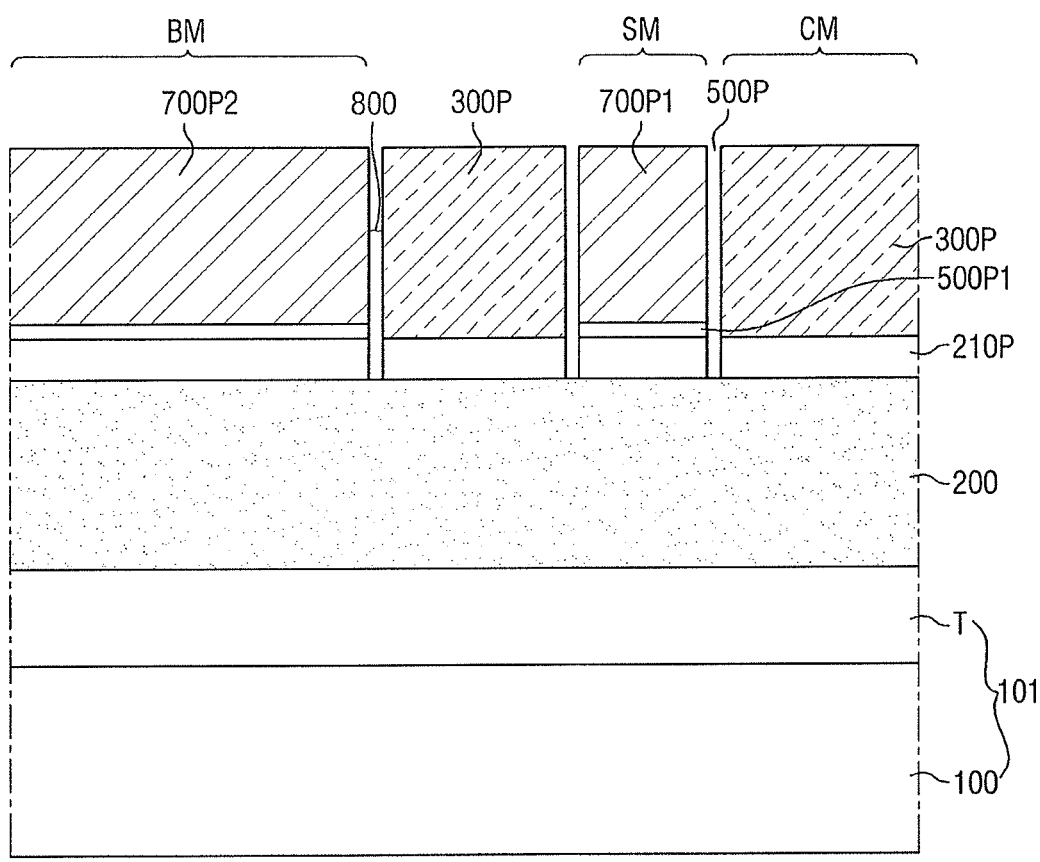

Next, referring to FIGS. 12A and 12B, an upper first mask pattern 210P may be formed by removing a portion of the spacer pattern 500P and patterning upper portions 210 of the first mask layers 200, 210. In detail, the second portion of the spacer pattern 500P in contact with the side surfaces of the first filler pattern 700P1 and the second filler pattern 700P2 may be removed to define a space 800, and the first portion of the spacer pattern 500P in contact with the lower surfaces of the first filler pattern 700P1 and the second filler pattern 700P2 may remain.

A stack pattern of the second mask pattern 300p and the upper first mask pattern 210P may be regarded as a core mask pattern CM. Further, a stack pattern of the first filler pattern 700P1, the spacer pattern 500P1, and the upper first mask pattern 210P may be regarded as a self-aligning mask pattern SM. Further, a stack pattern of the second filler pattern 700P2, the spacer pattern 500P1, and the upper first mask pattern 210P may be regarded as a background mask pattern BM. At this time, a side surface of the self-aligning mask pattern may be smoothed by etching. That is, the concave surface portion may be flattened to a linear shape or a convex shape. This may be generated due to higher etch rate of the sharp protruding portion.

Figure 13A:
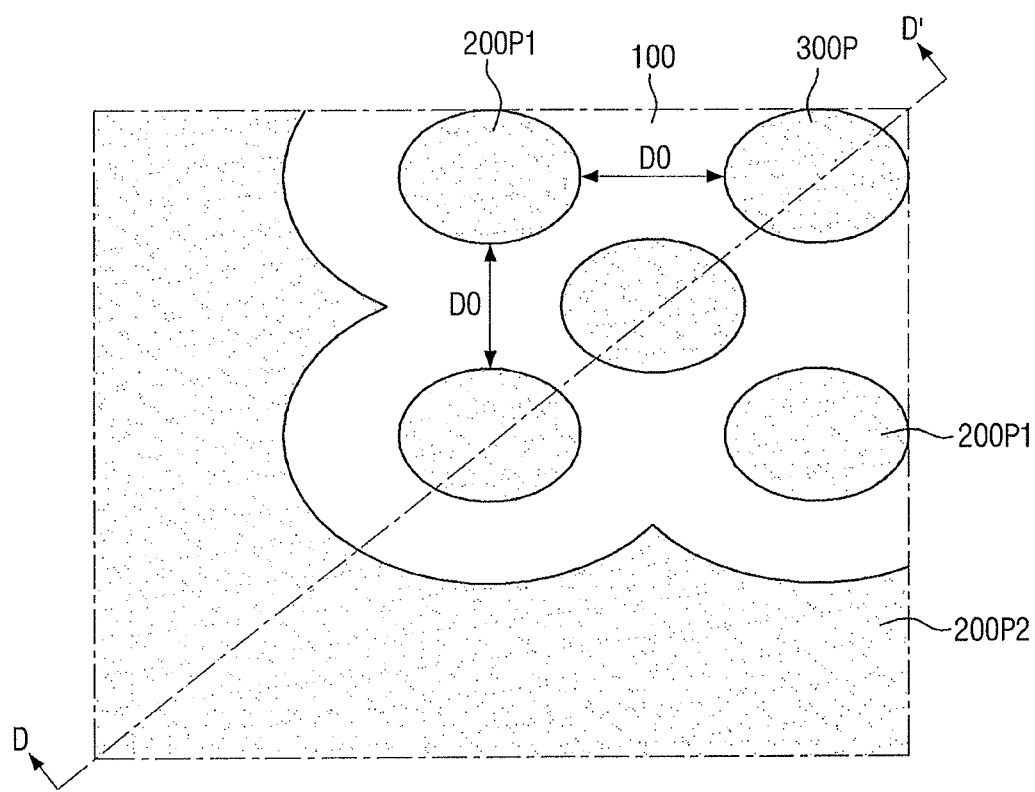
Figure 13B:
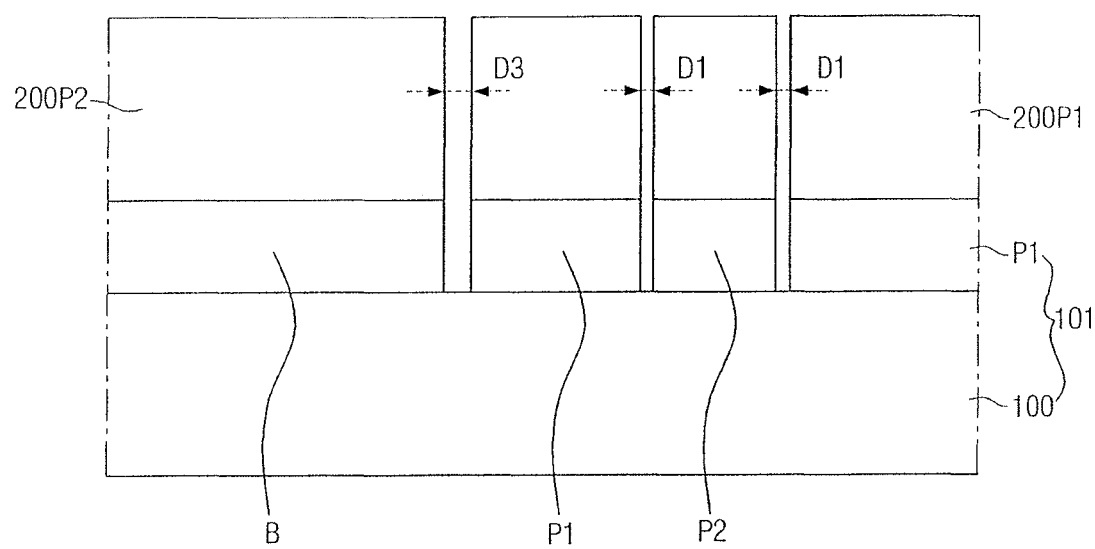

Next, referring to FIGS. 13A and 13B, the first mask patterns 200p1, 200p2, the first pillar pattern P1, the second pillar pattern P2, and the background pattern B are formed by etching the first mask layers 200, 210, and the target layer T with the core mask pattern, the self-aligning mask pattern, and the background mask pattern as a mask. At this time, during the etching the second pillar pattern P2 may be further smoothed to have a circular or elliptic shape, as will be described in more detail with reference to FIG. 15.

Figure 14A:
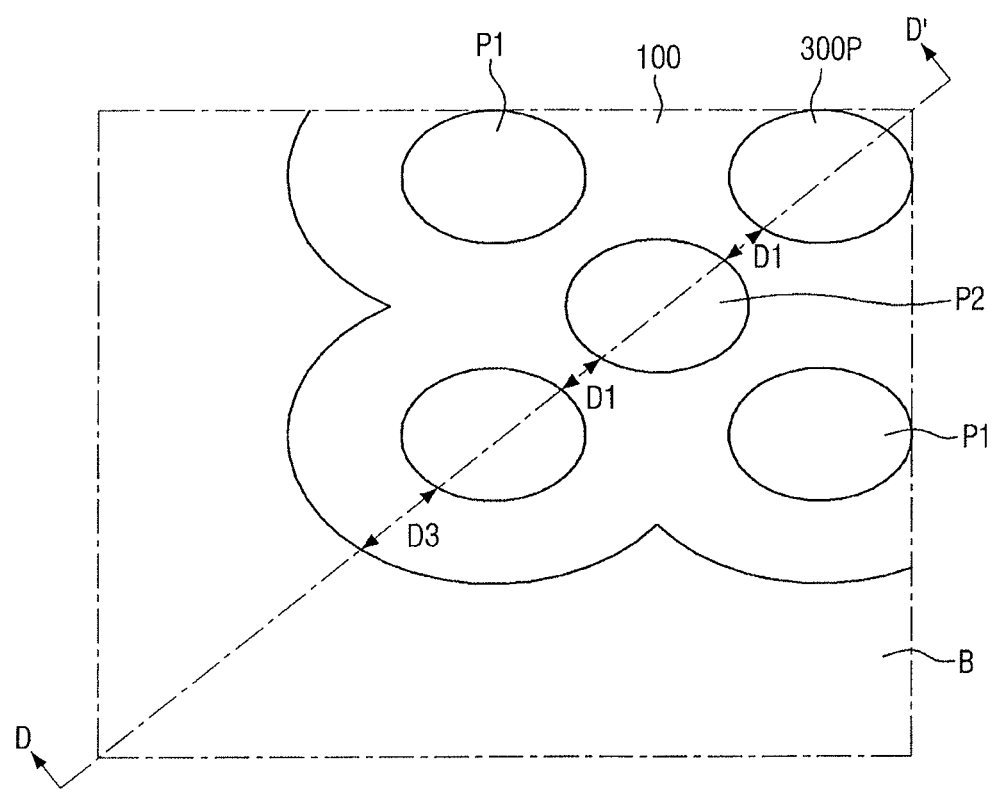
Figure 14B:
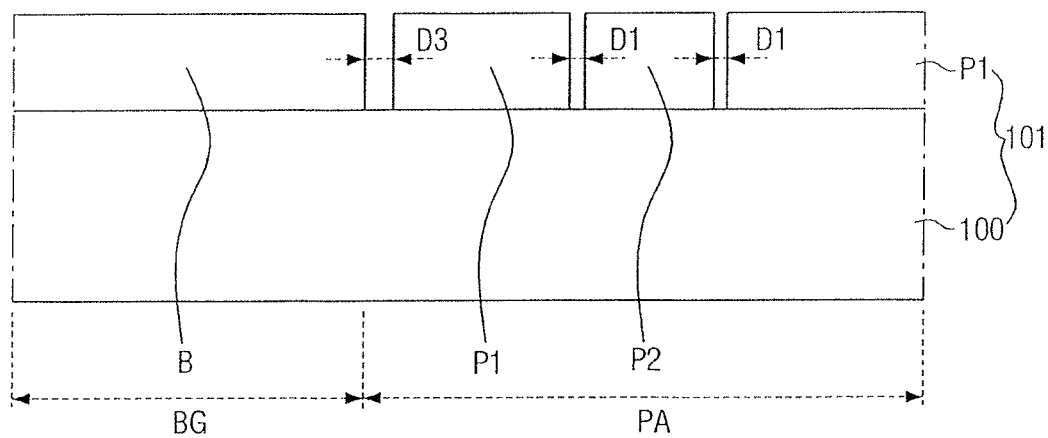

Next, referring to FIGS. 14A and 14B, the first mask patterns 200p1, 200p2 are removed. Accordingly, the background pattern B may be formed in the background region BG, and the first pillar pattern P1 and the second pillar pattern P2 may be formed in the array region PA. The distance D1 between the first pillar pattern P1 and the second pillar pattern P2 may be smaller than the distance D3 between the background pattern B and the first pillar pattern P1.

Figure 15:
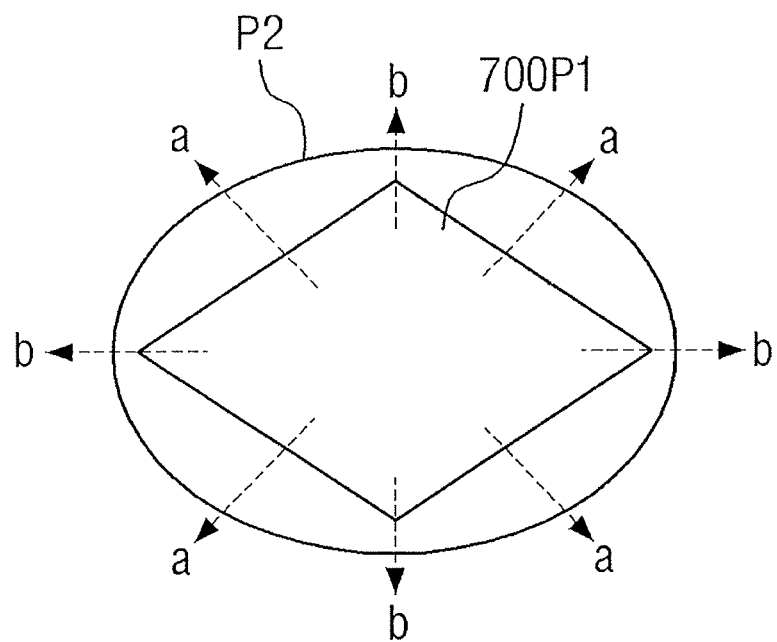

Referring to FIG. 15, the top view of the first filler pattern 700P1 (from an intermediate stage illustrated in FIG. 12A) and the top view of the resultant second pillar pattern P2 (from FIG. 14A) overlap for comparison purpose. The first filler pattern 700P1 may have a rhombus shape, and the second pillar pattern P2 may have a circular or elliptical shape. That is, the target layer T may be etched smoother than a mask shape by an etch process using the first filler pattern 700P1 as a mask. That is, as illustrated in FIG. 15, smoothing, e.g., removal of material, may be higher at a wide surface portion (a) than at a sharp edge portion (b). Accordingly, the second pillar pattern P2 may have a circular or elliptic shape.

Hereinbelow, a method for fabricating a semiconductor device according to some exemplary embodiments will be explained with reference to FIGS. 16A to 21. The elements or operation of the semiconductor device and a method for fabricating the same overlapping with those described previously will be mentioned as briefly as possible or omitted for the sake of brevity.

Figure 16A:
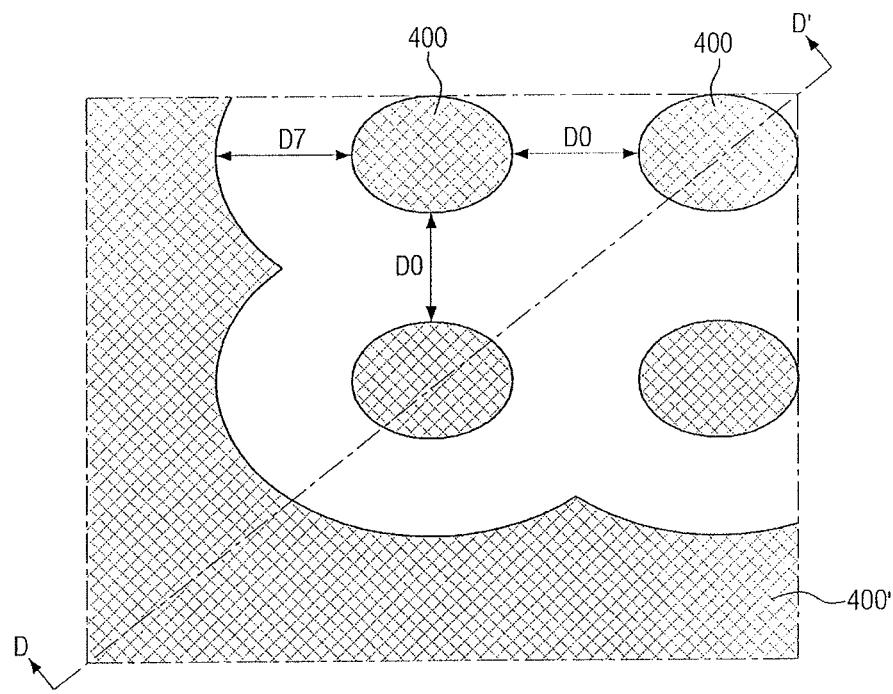
FIGS. 16A to 21 illustrate views illustrating intermediate stages in a method of fabricating a semiconductor device according to some exemplary embodiments.

FIGS. 16A to 21 are views illustrating intermediate stages of fabrication, provided to explain a semiconductor device according to some exemplary embodiments. FIG. 16A is a partial top view, and FIGS. 16B to 21 are cross sectional views taken along line D-D' of FIG. 16A.

Figure 16B:
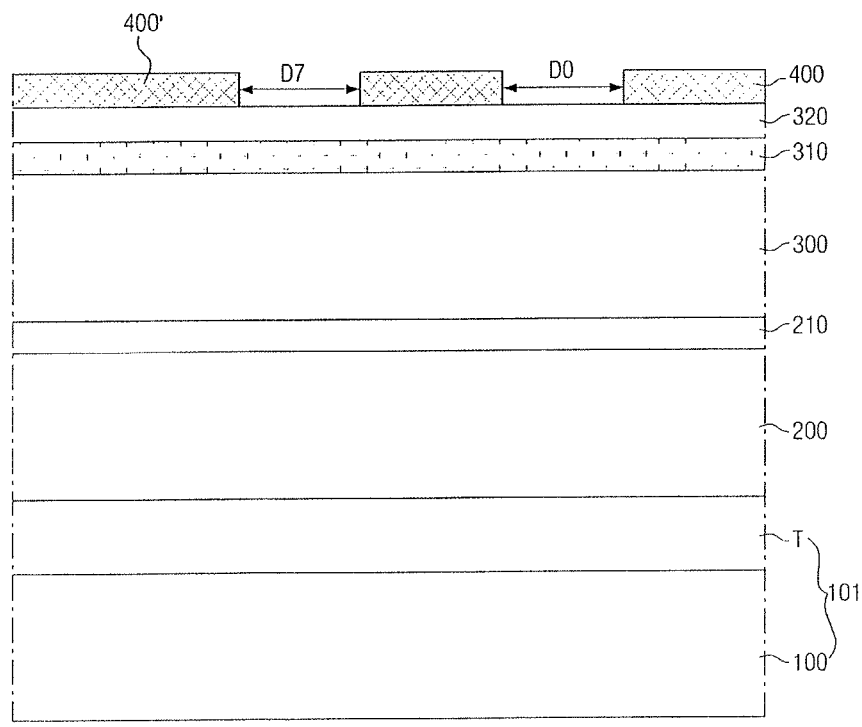

First, referring to FIGS. 16A and 16B, the photoresist pattern 400, and a background photoresist pattern 400' may be formed on a stack structure.

The photoresist pattern 400 may include portions spaced apart from each other by the predetermined distance D0. The photoresist pattern 400 may have an elliptical or circular shape, but is not limited thereto.

The background photoresist pattern 400' may be formed a predetermined distance D7 apart from the photoresist pattern 400. The distance between the background photoresist pattern 400' and the photoresist pattern 400 may be greater than the distance between adjacent portions of the photoresist patterns 400, e.g., D7>D0. For example, the predetermined distance D7 of the background photoresist pattern 400' from the photoresist pattern 400 may be about 0.3 to about 1 μm.

Figure 17:
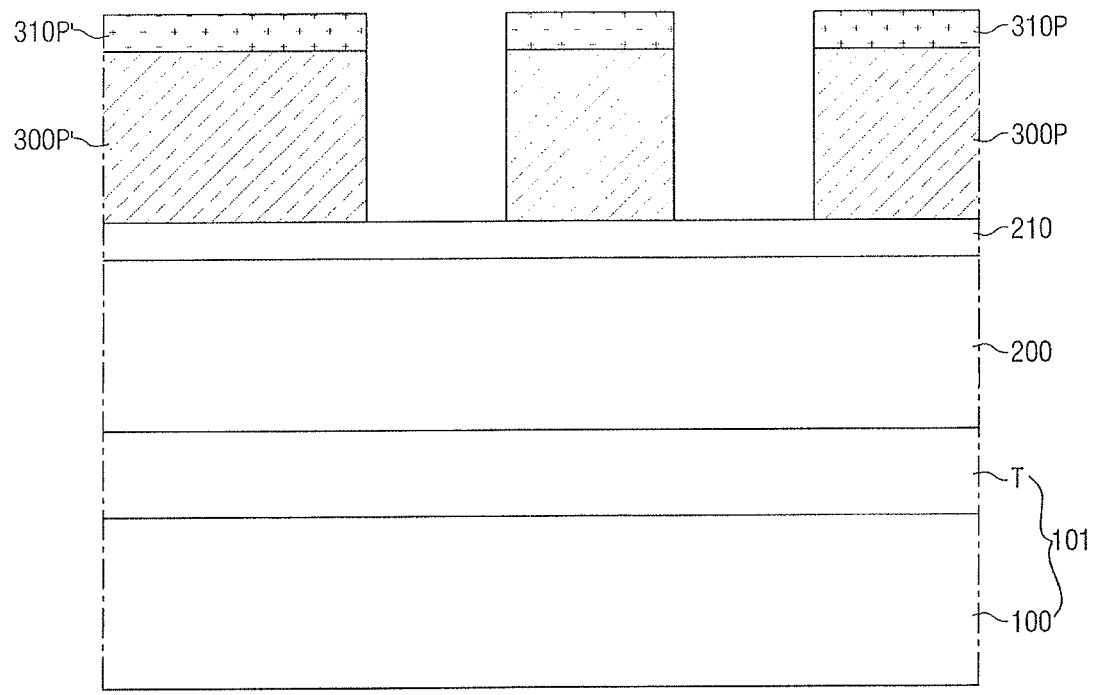

Next, referring to FIG. 17, the second mask layers 300, 310 may be etched with the photoresist pattern 400 and the background photoresist pattern 400' as a mask. That is, except for the portions where the photoresist pattern 400 and the background photoresist pattern 400' are positioned, the second mask layers 300, 310 may be etched with anisotropic etching in a vertical direction so that the second mask patterns 300p, 310p, and the background second mask patterns 300p', 310p' are formed. The background photoresist pattern 400', the photoresist pattern 400, and the anti-reflection layer 320 may be removed during an etch process or entirely removed by additional process. The background second mask patterns 300p', 310p', and the second mask patterns 300p, 310p may expose the first mask layers 200, 210.

Figure 18:
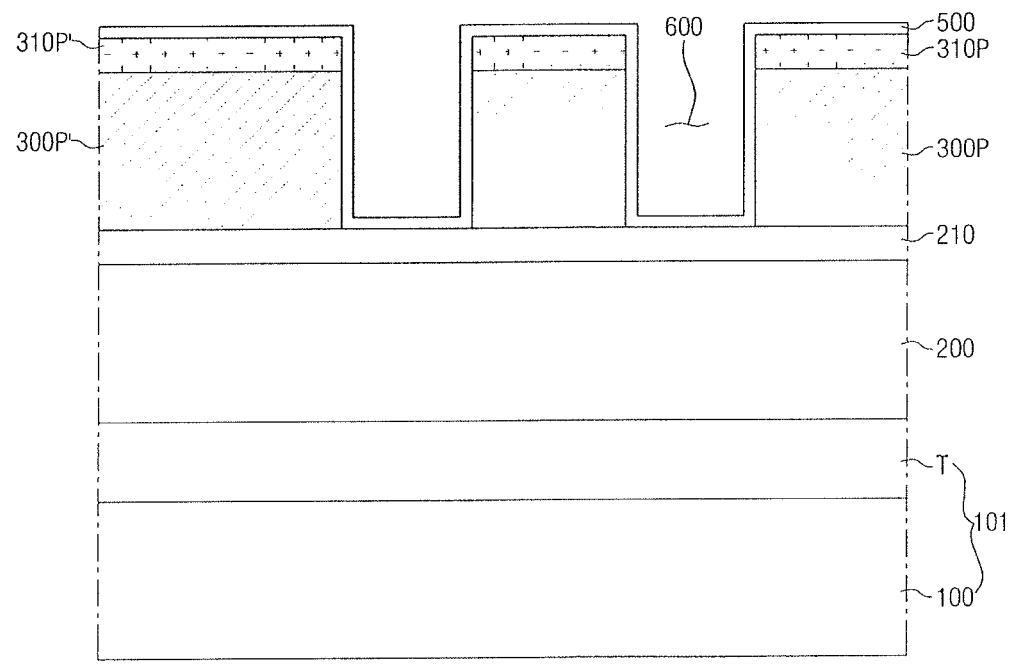

Next, referring to FIG. 18, the spacer film 500 may be formed. The spacer film 500 may overlie the upper portions 210 of the first mask layers 200, 210, and the upper portions 310p of the background second mask patterns 300p', 310p' and the second mask patterns 300p, 310p. The spacer film 500 may also be formed on side surfaces of the background second mask patterns 300p', 310p' and the second mask patterns 300p, 310p. Specifically, the spacer film 500 may be formed conformally along the upper surfaces and the side surfaces of the background second mask patterns 300p', 310p' and the second mask patterns 300p, 310p, and the upper surfaces of the first mask layers 200, 210.

At this time, the self-aligning groove 600 may be formed between the second mask patterns 300p, 310p. The self-aligning groove 600 may be spaced apart from the second mask patterns 300p, 310p by a predetermined distance. That is, it may be spaced apart by a thickness of the spacer film 500.

Figure 19:
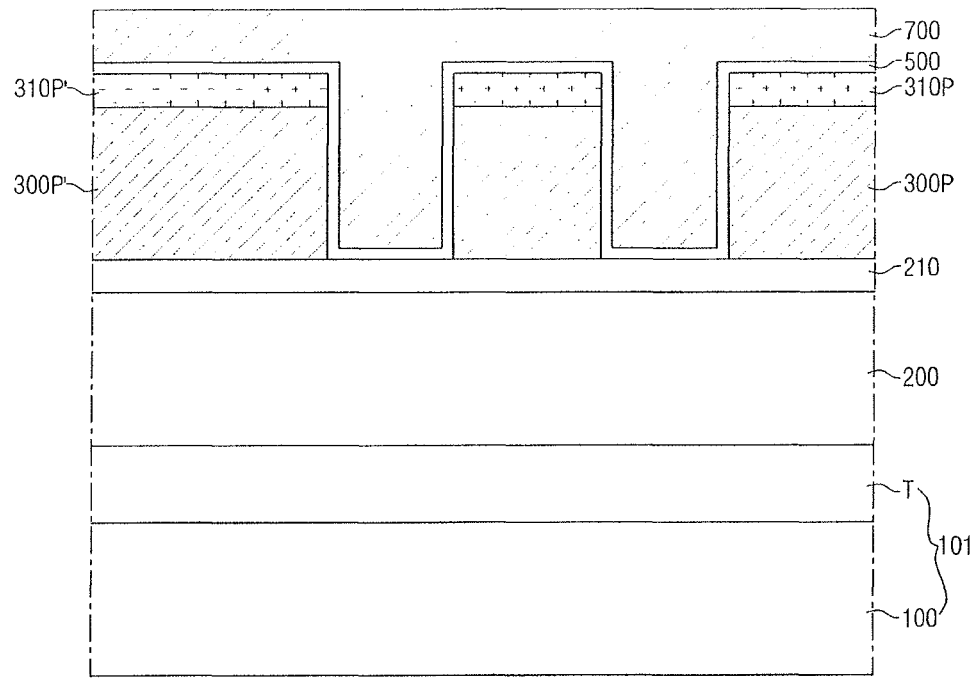

Next, referring to FIG. 19, the filler 700 is formed on the spacer film 500. The filler 700 may overlie the spacer film 500. The filler 700 may entirely fill the self-aligning groove 600. An upper surface of the filler 700 may be formed higher than the upper surfaces of the background second mask patterns 300p', 310p', the second mask patterns 300p, 310p, and the spacer film 500.

At this time, due to the presence of the background second mask patterns 300p', 310p', an upper surface of the filler 700 may be formed higher than the upper surfaces of the background second mask patterns 300$p'$, 310$p'$, the second mask patterns 300$p$, 310$p$, and the spacer film 500. That is, the background second mask patterns 300$p'$, 310$p'$ may be formed to prevent the upper surface of the filler from being lowered by the loading effect as the distance increases from the second mask patterns 300$p$, 310$p$.

Figure 20:
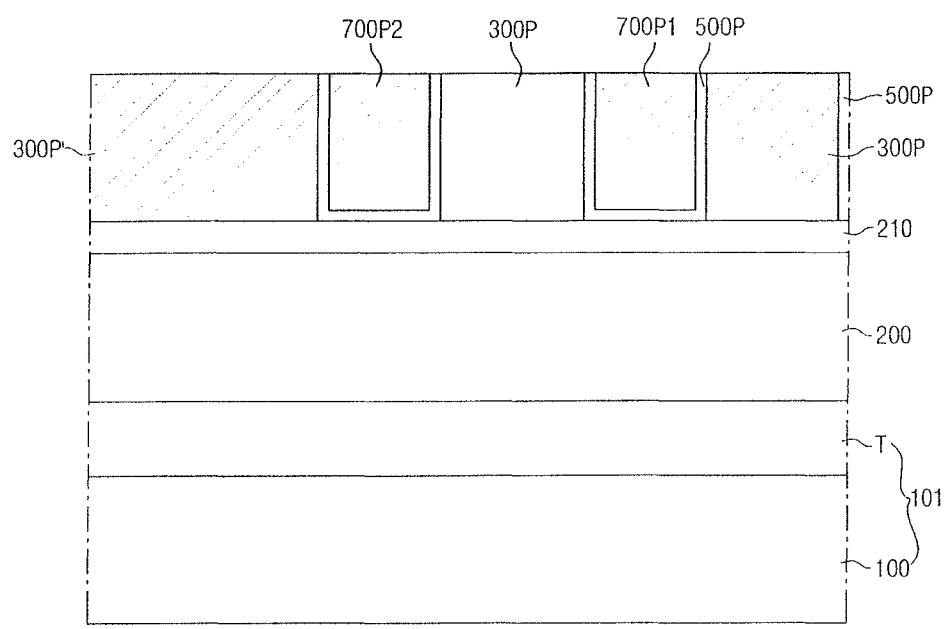

Next, referring to FIG. 20, the first filler pattern 700P1 and the second filler pattern 700P2 are formed by partially removing the filler 700 and the spacer film 500. The first filler pattern 700P1 may be positioned in the self-aligning groove 600, and a lower surface and a side surface may be surrounded by the spacer pattern 500P. A lower surface and a side surface of the second filler pattern 700P2 may also be surrounded by the spacer pattern 500P. The spacer pattern 500P may include a first portion in contact with lower surfaces of the first filler pattern 700P1 and the second filler pattern 700P2, and a second portion in contact with side surfaces of the first filler pattern 700P1 and the second filler pattern 700P2.

Figure 21:
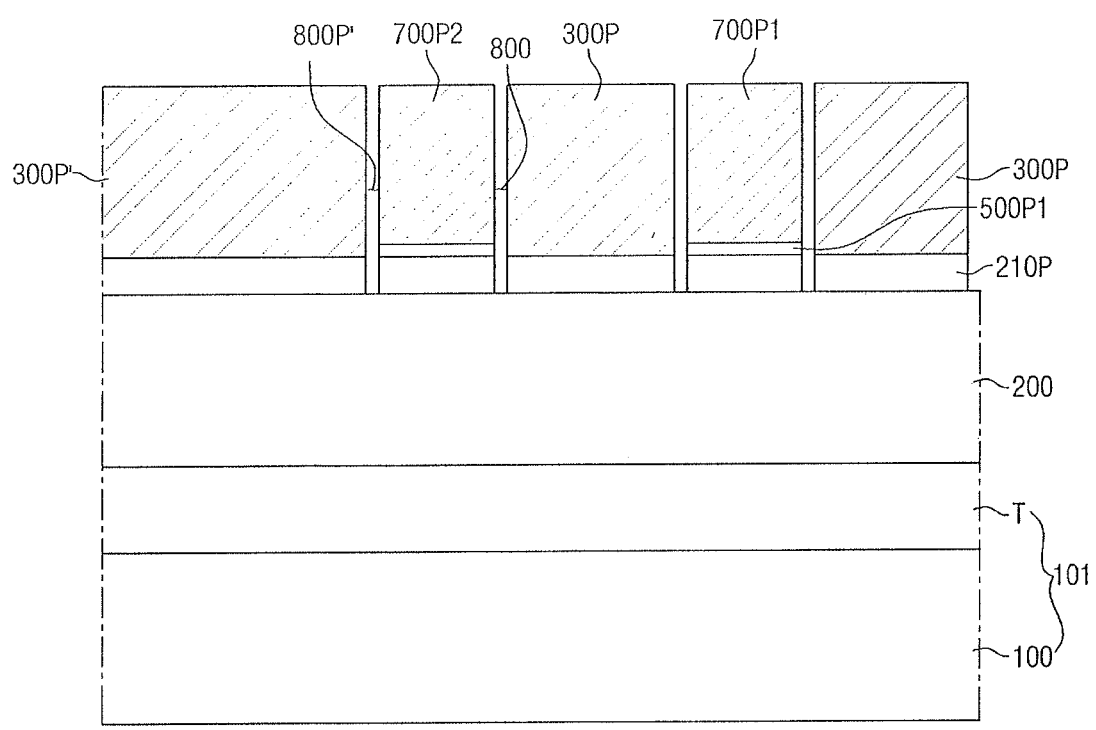

Next, referring to FIG. 21, an upper first mask pattern 210P may be formed by removing a portion of the spacer pattern 500P and patterning upper portions 210 of the first mask layers 200, 210. In detail, the second portion of the spacer pattern 500P in contact with side surfaces of the first filler pattern 700P1 and the second filler pattern 700P2 may be removed, and the first portion of the spacer pattern 500P in contact with lower surfaces of the first filler pattern 700P1 and the second filler pattern 700P2 may remain.

A stack pattern of the second mask patterns 300$p$, 310$p$ and the upper first mask pattern 210P may be regarded as a core mask pattern. Further, a stack pattern of the first filler pattern 700P1, the spacer pattern 500P1, and the upper first mask pattern 210P may be regarded as a self-aligning mask pattern. Further, a stack pattern of the second filler pattern 700P2, the spacer pattern 500P1, and the upper first mask pattern 210P may be regarded as a background mask pattern.

At this time, a side surface of the self-aligning mask pattern may be smoothed by etching. That is, the concave surface portion may be flattened to a linear shape or a convex shape. This may be generated due to higher etch rate of the sharp protruding portion. After that, the first pillar pattern P1 and the second pillar pattern P2 may be formed through the same processes as those illustrated in FIGS. 13A to 14B.

Figure 22:
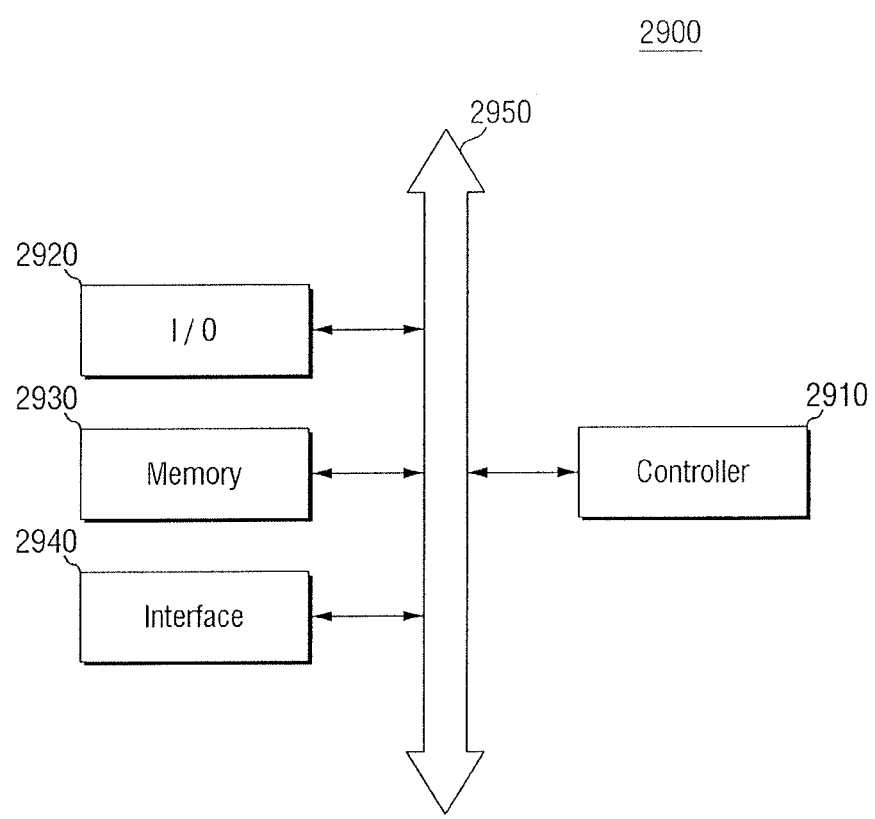
FIG. 22 illustrates a block diagram of an example of an electronic system including a semiconductor device according to exemplary embodiments.

FIG. 22 is an exemplary block diagram of an electronic system including a semiconductor device according to some exemplary embodiments.

Referring to FIG. 22, the electronic system 2900 according to some exemplary embodiments may include a controller 2910, an input/output (I/O) device 2920, a memory device 2930, an interface 2940, and a bus 2950. The controller 2910, the I/O device 2920, the memory device 2930 and/or the interface 2940 may be connected with one another via the bus 2950. The bus 2950 corresponds to a path through which data travels. The controller 2910 may include at least one of, e.g., microprocessor, digital signal processor, micro controller, or logic devices capable of performing functions similar to the functions of those mentioned above. The I/O device 2920 may include, e.g., a keypad, a keyboard, a display device and so on. The memory device 2930 may store data and/or commands. The memory device 2930 may include a semiconductor device according to some exemplary embodiments. The memory device 2930 may include, e.g., a dynamic random access memory (DRAM) device. The interface 2940 may perform a function of transmitting or receiving data to or from communication networks. The interface 2940 may be in a wired or wireless form. For example, the interface 2940 may include an antenna or a wired/wireless transceiver.

The electronic system 2900 is applicable to, e.g., a personal digital assistant (PDA) portable computer, a web tablet, a wireless phone, a mobile phone, a digital music player, a memory card, or all electronic products that are capable of transmitting and/or receiving data in wireless environment.

Figure 23:
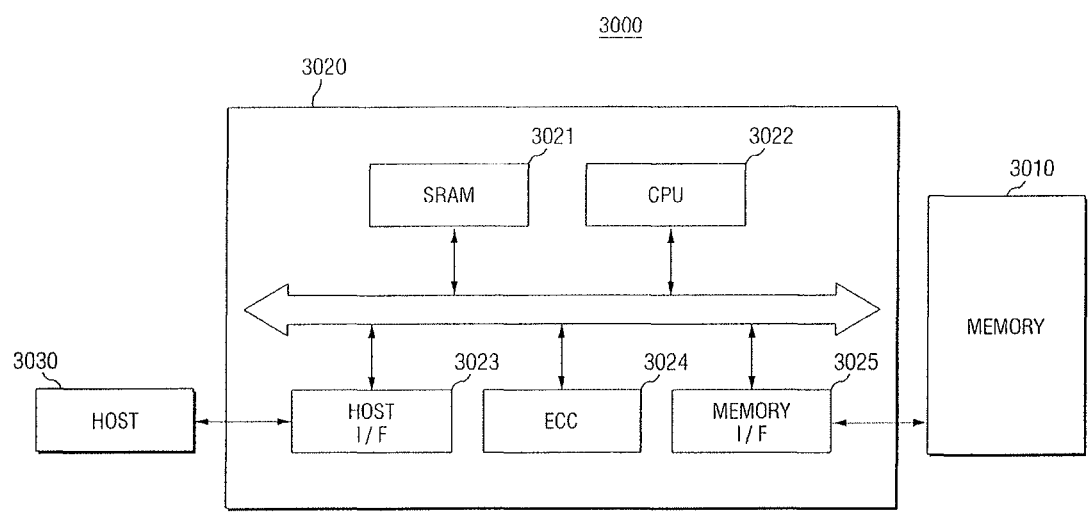
FIG. 23 illustrates a block diagram of an example of a memory card including a semiconductor device according to exemplary embodiments.

FIG. 23 is a block diagram of an example of a memory card including a semiconductor device fabricated according to a method for fabricating a semiconductor device according to exemplary embodiments.

Referring to FIG. 23, a memory 3010 including a semiconductor device fabricated according to various exemplary embodiments may be employed in a memory card 3000. The memory card 3000 may include a memory controller 3020 to control data exchange between a host 3030 and the memory 3010. A static random access memory (SRAM) 3021 may be used as an operating memory of a central processing unit 3022. A host interface 3023 may include protocol so that the host 3030 accesses the memory card 3000 and exchanges data. An error correction code 3024 may detect an error in the data read from the memory 3010 and correct it. A memory interface 3025 may interface with the memory 3010. The central processing unit 3022 may perform overall control operation associated with the data exchange of a memory controller 3020.

Embodiments provide a semiconductor device with improved operating characteristics, as well as a method for fabricating a semiconductor device with improved operating characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
sequentially forming first and second mask layers on a substrate;
forming core mask patterns spaced apart from each other by a first equal distance, by patterning the second mask layer;
forming a spacer film conformally covering the core mask patterns, while forming self-aligning grooves between the core mask patterns;
forming a filler to entirely fill the self-aligning grooves;
forming self-aligning mask patterns between the core mask patterns by removing a portion of the spacer film, wherein the self-aligning mask patterns are formed as a stacked portion of the spacer film and the filler, the core mask patterns and the self-aligning mask patterns are spaced apart from each other by a second equal distance;

patterning the first mask layer into a first mask pattern, with the core mask patterns and the self-aligning mask patterns as a mask; and forming a pillar array pattern by patterning with the first mask pattern as a mask, wherein shapes of cross sections of the self-aligning grooves include a plurality of edges, and a plurality of concave portions connecting the plurality of edges and concave in a direction oriented toward an interior of the self-aligning grooves.

2. The method as claimed in claim 1, wherein slopes of side surfaces of the self-aligning mask patterns are continuous.

3. The method as claimed in claim 2, wherein forming the self-aligning mask patterns includes smoothing, by partially etching the side surfaces of the self-aligning mask patterns.

4. The method as claimed in claim 1, wherein the shapes of cross sections of the self-aligning grooves is a rhombus shape having concave sides.

5. The method as claimed in claim 4, wherein the concave sides of the rhombus shape are defined by a curved outer periphery of the spacer film surrounding the core mask patterns.

6. The method as claimed in claim 1, wherein the shapes of cross sections of the self-aligning grooves is a honeycomb shape having concave sides.

7. A method for fabricating a semiconductor device, the method comprising:

sequentially forming first and second mask layers on a substrate including a first array region and a first background region;

forming, in the first array region, core mask patterns spaced apart from each other by a first equal distance, by patterning the second mask layer;

forming a spacer film conformally covering the core mask patterns, wherein the spacer film is defined so that self-aligning grooves are formed between the core mask patterns, and the array region and the first background region are separated along an outer surface of the spacer film formed on side surfaces of the core mask patterns;

forming a filler on the spacer film to entirely fill the self-aligning grooves and the first background region;

forming, in the first array region, self-aligning mask patterns between the core mask patterns by removing a portion of the spacer film, wherein the self-aligning mask patterns are formed as a stacked portion of the spacer film and the filler, and forming background mask patterns in the first background region, wherein the background mask patterns are formed as a stacked portion of the spacer film and the filler;

patterning the first mask layer into a first mask pattern, with the core mask patterns, the self-aligning mask patterns, and the background mask patterns as a mask; and forming pillar array patterns and background patterns in the first array region and the first background region, respectively, by patterning with the first mask pattern as a mask, wherein shapes of cross sections of the self-aligning grooves include a plurality of edges, and a plurality of concave portions connecting the plurality of edges and concave in a direction oriented toward an interior of the self-aligning grooves.

8. The method as claimed in claim 7, wherein the background patterns are formed apart from the pillar array patterns by a second distance that is greater than a distance between adjacent ones of the pillar array patterns.

9. The method as claimed in claim 8, wherein the second distance is 0.3 to 1 μm.

10. The method as claimed in claim 7, wherein forming the core mask patterns includes forming patterns only in the first array region among the first array region and the first background region, such that no patterns are formed in the first background region before forming the spacer film.

11. The method as claimed in claim 7, wherein:

the substrate includes a first region including the first array region and the first background region, and a second region including a second array region and a second background region, and the method includes forming, in the second region, a second background pattern having a linear portion having a flat outer surface, and a convex portion that is more convex than the linear portion toward the second array region.

12. The method as claimed in claim 7, wherein slopes of side surfaces of the self-aligning mask patterns are continuous.

13. The method as claimed in claim 12, wherein forming the self-aligning mask patterns includes smoothing, by partially etching the side surfaces of the self-aligning mask patterns.

14. A method for fabricating a semiconductor device, the method comprising:

sequentially forming first and second mask layers on a substrate including an array region and a background region;

forming core mask patterns and first background mask patterns in the array region and the background region, respectively, by patterning the second mask layer, wherein the core mask patterns are spaced apart from each other by a first equal distance, and the first background mask patterns are spaced apart from the core mask patterns by a second distance;

forming a spacer film conformally covering the core mask patterns and the first background mask patterns, wherein self-aligning grooves between the core mask patterns and background grooves between the core mask patterns and the first background mask patterns are defined by the spacer film, and wherein the array region and the background region are separated along an outer surface of the spacer film formed on side surfaces of the core mask patterns;

filling the self-aligning grooves and the background grooves entirely to form a filler;

forming, in the array region, self-aligning mask patterns between the core mask patterns by removing a portion of the spacer film around the self-aligning grooves;

exposing, in the background region, the first background mask patterns adjacent to outermost ones of the core mask patterns by removing a portion of the spacer film around the background grooves;

patterning the first mask layer into first mask patterns, with the core mask patterns, the self-aligning mask patterns, and the first background mask patterns as a mask; and forming pillar array patterns and background patterns in the array region and the background region, respectively, by patterning with the first mask patterns as a mask, wherein shapes of cross sections of the self-aligning grooves include a plurality of edges, and a plurality of concave portions connecting the plurality of edges and concave in a direction oriented toward an interior of the self-aligning grooves.

15. The method as claimed in claim 14, wherein the self-aligning mask patterns are formed as a stacked portion of the spacer film and the filler.

16. The method as claimed in claim 14, wherein the core mask patterns and the self-aligning mask patterns are spaced apart from each other by a third equal distance.

17. The method as claimed in claim 14, wherein the second distance is greater than the first equal distance.

* * * * *